United States Patent
Kim et al.

(10) Patent No.: US 10,230,021 B2
(45) Date of Patent: Mar. 12, 2019

(54) LIGHT EMITTING DEVICE PACKAGE

(71) Applicant: SAMSUNG ELECTRONICS CO., LTD., Suwon-si (KR)

(72) Inventors: Yong Il Kim, Seoul (KR); Hyong Sik Won, Yongin-si (KR); Wan Tae Lim, Suwon-si (KR); Nam Goo Cha, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/279,864

(22) Filed: Sep. 29, 2016

(65) Prior Publication Data

US 2017/0092820 A1   Mar. 30, 2017

(30) Foreign Application Priority Data

Sep. 30, 2015   (KR) .................. 10-2015-0137334
Jul. 7, 2016   (KR) .................. 10-2016-0086022

(51) Int. Cl.
  *H01L 33/50*   (2010.01)
  *H01L 33/08*   (2010.01)
  (Continued)

(52) U.S. Cl.
  CPC .......... *H01L 33/50* (2013.01); *H01L 25/0753* (2013.01); *H01L 33/08* (2013.01); *H01L 33/32* (2013.01); *H01L 33/44* (2013.01); *H01L 27/156* (2013.01); *H01L 33/38* (2013.01); *H01L 33/58* (2013.01)

(58) Field of Classification Search
  CPC .................. H01L 33/08; H01L 33/46; H01L 33/50–33/504
  See application file for complete search history.

(56) References Cited

U.S. PATENT DOCUMENTS

| | | | |
|---|---|---|---|
| 6,372,608 B1 | 4/2002 | Shimoda et al. | |
| 6,645,830 B2 | 11/2003 | Shimoda et al. | |

(Continued)

FOREIGN PATENT DOCUMENTS

| | | |
|---|---|---|
| CN | 1469330 A | 1/2004 |
| CN | 103119735 A | 5/2013 |

(Continued)

OTHER PUBLICATIONS

Communication dated Nov. 14, 2018, issued by the State Intellectual Property Office of P.R. China in counterpart Chinese Application No. 201610868430.4.

*Primary Examiner* — Jose R Diaz
(74) *Attorney, Agent, or Firm* — Sughrue Mion, PLLC

(57) ABSTRACT

A light emitting device package may include: a light emitting structure including a plurality of light emitting regions configured to emit light, respectively; a plurality of light adjusting layers formed above the light emitting regions to change characteristics of the light emitted from the light emitting regions, respectively; a plurality of electrodes configured to control the light emitting regions to emit the light, respectively; and an isolation insulating layer disposed between the light emitting regions to insulate the light emitting regions from one another, the isolation insulating layer forming a continuous structure with respect to the light emitting regions.

22 Claims, 50 Drawing Sheets

(51) Int. Cl.
  *H01L 33/32* (2010.01)
  *H01L 25/075* (2006.01)
  *H01L 33/44* (2010.01)
  *H01L 33/38* (2010.01)
  *H01L 33/58* (2010.01)
  *H01L 27/15* (2006.01)

(56) References Cited

U.S. PATENT DOCUMENTS

| | | |
|---|---|---|
| 6,696,784 B2 | 2/2004 | Yoshida et al. |
| RE38,466 E | 3/2004 | Inoue et al. |
| 6,818,465 B2 | 11/2004 | Biwa et al. |
| 6,818,530 B2 | 11/2004 | Shimoda et al. |
| 6,858,081 B2 | 2/2005 | Biwa et al. |
| 6,967,353 B2 | 11/2005 | Suzuki et al. |
| 7,002,182 B2 | 2/2006 | Okuyama et al. |
| 7,084,420 B2 | 8/2006 | Kim et al. |
| 7,087,932 B2 | 8/2006 | Okuyama et al. |
| 7,154,124 B2 | 12/2006 | Han et al. |
| 7,208,725 B2 | 4/2007 | Sherrer et al. |
| 7,288,758 B2 | 10/2007 | Sherrer et al. |
| 7,319,044 B2 | 1/2008 | Han et al. |
| 7,501,656 B2 | 3/2009 | Han et al. |
| 7,696,522 B2 | 4/2010 | Ono et al. |
| 7,709,857 B2 | 5/2010 | Kim et al. |
| 7,759,140 B2 | 7/2010 | Lee et al. |
| 7,781,727 B2 | 8/2010 | Sherrer et al. |
| 7,790,482 B2 | 9/2010 | Han et al. |
| 7,804,640 B1 | 9/2010 | Bass et al. |
| 8,008,683 B2 | 4/2011 | Choi et al. |
| 7,940,350 B2 | 5/2011 | Jeong |
| 7,959,312 B2 | 6/2011 | Yoo et al. |
| 7,964,881 B2 | 6/2011 | Choi et al. |
| 7,985,976 B2 | 7/2011 | Choi et al. |
| 7,994,525 B2 | 8/2011 | Lee et al. |
| 8,013,352 B2 | 9/2011 | Lee et al. |
| 8,049,161 B2 | 11/2011 | Sherrer et al. |
| 8,129,711 B2 | 3/2012 | Kang et al. |
| 8,179,938 B2 | 5/2012 | Kim |
| 8,263,987 B2 | 9/2012 | Choi et al. |
| 8,324,646 B2 | 12/2012 | Lee et al. |
| 8,399,944 B2 | 3/2013 | Kwak et al. |
| 8,432,511 B2 | 4/2013 | Jeong |
| 8,459,832 B2 | 6/2013 | Kim |
| 8,502,242 B2 | 8/2013 | Kim |
| 8,536,604 B2 | 9/2013 | Kwak et al. |
| 8,735,931 B2 | 5/2014 | Han et al. |
| 8,766,295 B2 | 7/2014 | Kim |
| 9,018,655 B2 | 4/2015 | Tu et al. |
| 2003/0230972 A1 | 12/2003 | Cok |
| 2012/0074441 A1 | 3/2012 | Seo et al. |
| 2013/0146903 A1* | 6/2013 | Ichikawa et al. ....... H01L 33/50 257/88 |
| 2014/0055982 A1 | 2/2014 | Tao et al. |
| 2014/0191246 A1 | 7/2014 | Oraw |
| 2014/0209930 A1 | 7/2014 | Weng et al. |
| 2015/0116985 A1 | 4/2015 | Bang |
| 2015/0140702 A1 | 5/2015 | Ikeda |

FOREIGN PATENT DOCUMENTS

| | | |
|---|---|---|
| CN | 103972374 A | 8/2014 |
| EP | 3 156 841 A1 | 4/2017 |
| KR | 10-2005-0063254 A | 6/2005 |
| KR | 10-1039974 B1 | 6/2011 |
| KR | 10-2013-0137985 A | 12/2013 |
| KR | 10-1476207 B1 | 12/2014 |
| KR | 10-2015-0035114 A | 4/2015 |

\* cited by examiner

IX–IX'

LIGHT EMITTING DEVICE PACKAGE

CROSS-REFERENCE TO THE RELATED APPLICATIONS

This application claims priority from Korean Patent Application No. 10-2016-0086022 filed on Jul. 7, 2016 and Korean Patent Application No. 10-2015-0137334 filed on Sep. 30, 2015 with the Korean Intellectual Property Office, the disclosures of which are incorporated herein by reference in their entirety.

BACKGROUND

Apparatuses consistent with exemplary embodiments relate to a light emitting device package.

Semiconductor light emitting devices are widely seen as next generation lighting sources having many advantages such as relatively long lifespans, low degrees of power consumption, rapid response speeds, and environmental friendliness, and have come to prominence as an important type of light source for use in various products such as in general lighting devices and in the backlights of display devices. In particular, nitride-based light emitting devices based on Group III nitrides, such as gallium nitride (GaN), aluminum gallium nitride (AlGaN), indium gallium nitride (InGaN), and indium aluminum gallium nitride (InAlGaN), play an important role as semiconductor light emitting devices outputting blue or ultraviolet light.

Thus, as light emitting devices (LEDs) have extended to various fields for the purpose of lighting (or illumination), miniaturized packages are required to secure a degree of freedom of design fitting respective purposes.

SUMMARY

An aspect may provide a miniaturized light emitting device package capable of realizing various colors. An aspect may provide a miniaturized light emitting device package including an expanded bonding pad.

According to an example embodiment, there is provided a light emitting device package which may include: a light emitting structure including a plurality of light emitting regions configured to emit light, respectively; a plurality of light adjusting layers formed above the light emitting regions to change characteristics of the light emitted from the light emitting regions, respectively; a plurality of electrodes configured to control the light emitting regions to emit the light, respectively; and an isolation insulating layer disposed between the light emitting regions to insulate the light emitting regions from one another, the isolation insulating layer forming a continuous structure with respect to the light emitting regions.

According to an example embodiment, there is provided a light emitting device package which may include: a light emitting structure divided into a plurality of light emitting regions configured to emit light, respectively; a plurality of light adjusting layers formed above the light emitting regions to convert characteristics of the light emitted from the light emitting regions, respectively; and a plurality of electrodes disposed opposite to the light adjusting layers with respect to light emitting structure and configured to respectively control the light emitting regions to emit the light, wherein the light emitting structure forms a single chip.

According to an example embodiment, there is provided a method of manufacturing a light emitting device package. The method may include: providing a substrate; growing, on the substrate, an epitaxial layer comprising a first conductivity-type semiconductor layer, an active layer and a second conductivity-type semiconductor layer; forming a light emitting structure comprising a plurality of light emitting regions and corresponding to an individual chip, in the epitaxial layer; forming a plurality of electrodes configured to control the light emitting regions on a side of the light emitting structure; forming an isolation insulating layer comprising side insulation portions disposed between the light emitting regions; and forming a plurality of light adjusting layers above the light emitting regions, respectively, wherein the light adjusting layers are disposed opposite to the electrodes with respect to the light emitting structure.

BRIEF DESCRIPTION OF DRAWINGS

The above and other aspects, features, and advantages of the inventive concept will be more clearly understood from the following detailed description taken in conjunction with the accompanying drawings, in which.

DETAILED DESCRIPTION

Figure 1A:
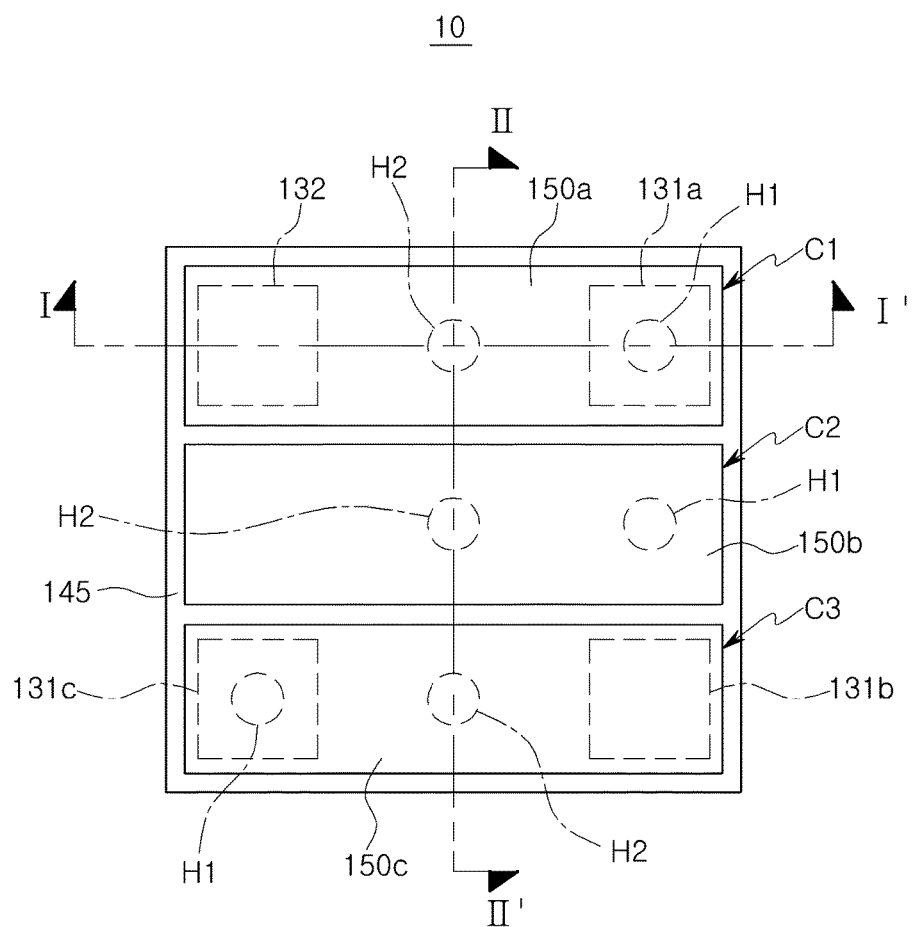
FIGS. 1A and 1B are a plan view and a rear view schematically illustrating a light emitting device package according to an example embodiment.

Hereinafter, example embodiments of the inventive concept will be described as follows with reference to the attached drawings.

The present inventive concept may, however, be exemplified in many different forms and should not be construed as being limited to the specific embodiments set forth herein. Rather, these embodiments are provided so that this disclosure will be thorough and complete, and will fully convey the scope of the disclosure to those skilled in the art.

Throughout the specification, it will be understood that when an element, such as a layer, region or wafer (substrate), is referred to as being "above," "on," "connected to," or "coupled to" another element, it can be directly "above," "on," "connected to," or "coupled to" the other element or other elements intervening therebetween may be present. In contrast, when an element is referred to as being "directly above," "directly on," "directly connected to," or "directly coupled to" another element, there may be no elements or layers intervening therebetween. Like numerals refer to like elements throughout. As used herein, the term "and/or" includes any and all combinations of one or more of the associated listed items.

It will be apparent that though the terms first, second, third, etc. may be used herein to describe various members, components, regions, layers and/or sections, these members, components, regions, layers and/or sections should not be limited by these terms. These terms are only used to distinguish one member, component, region, layer or section from another region, layer or section. Thus, a first member, component, region, layer or section discussed below could be termed a second member, component, region, layer or section without departing from the teachings of the example embodiments.

Spatially relative terms, such as "above," "upper," "below," and "lower" and the like, may be used herein for ease of description to describe one element's relationship to another element(s) as shown in the figures. It will be understood that the spatially relative terms are intended to encompass different orientations of the device in use or operation in addition to the orientation depicted in the figures. For example, if the device in the figures is turned over, elements described as "above," or "upper" other elements would then be oriented "below," or "lower" the other elements or features. Thus, the term "above" can encompass both the above and below orientations depending on a particular direction of the figures. The device may be otherwise oriented (rotated 90 degrees or at other orientations) and the spatially relative descriptors used herein may be interpreted accordingly.

The terminology used herein is for describing particular embodiments only and is not intended to be limiting. As used herein, the singular forms "a," "an," and "the" are intended to include the plural forms as well, unless the context clearly indicates otherwise. It will be further understood that the terms "comprises," and/or "comprising" when used in this specification, specify the presence of stated features, integers, steps, operations, members, elements, and/or groups thereof, but do not preclude the presence or addition of one or more other features, integers, steps, operations, members, elements, and/or groups thereof.

Hereinafter, embodiments will be described with reference to schematic views illustrating embodiments. In the drawings, for example, due to manufacturing techniques and/or tolerances, modifications of the shape shown may be estimated. Thus, embodiments should not be construed as being limited to the particular shapes of regions shown herein, for example, to include a change in shape results in manufacturing. The following embodiments may also be constituted by one or a combination thereof.

The contents described below may have a variety of configurations and propose only a required configuration herein, but are not limited thereto.

Figure 1B:
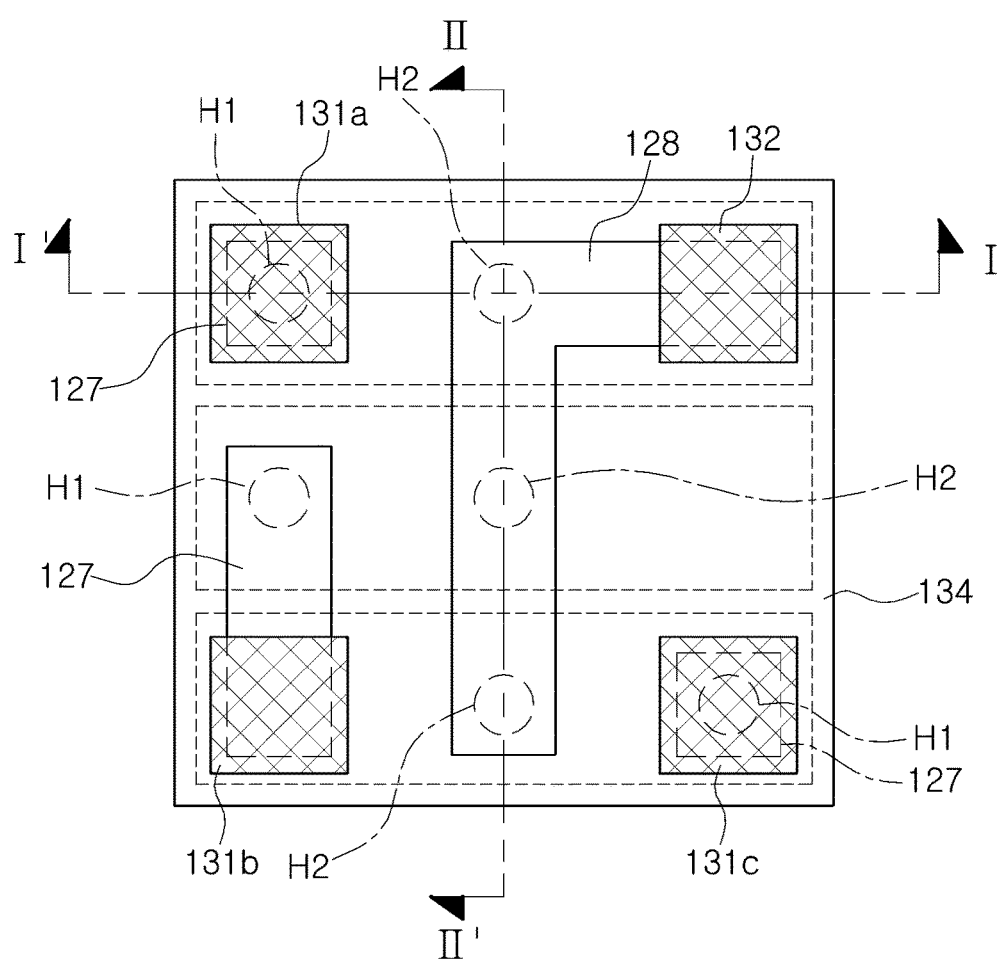
Figure 2A:
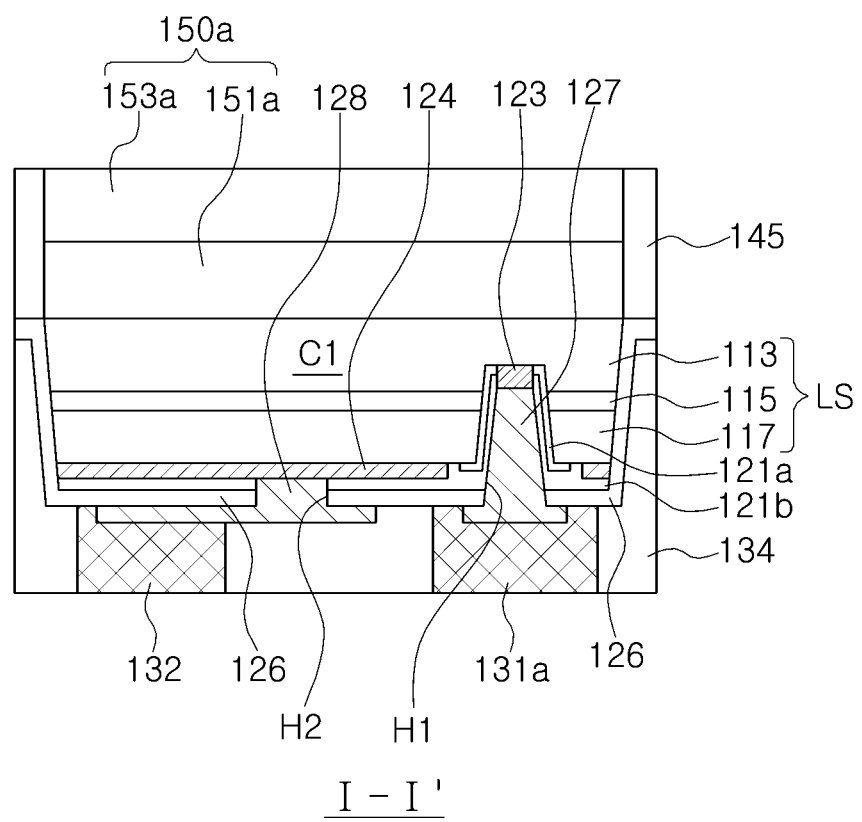
FIGS. 2A and 2B are cross-sectional views of the light emitting device package illustrated in FIG. 1A, taken along lines I-I' and II-II'.
Figure 2B:
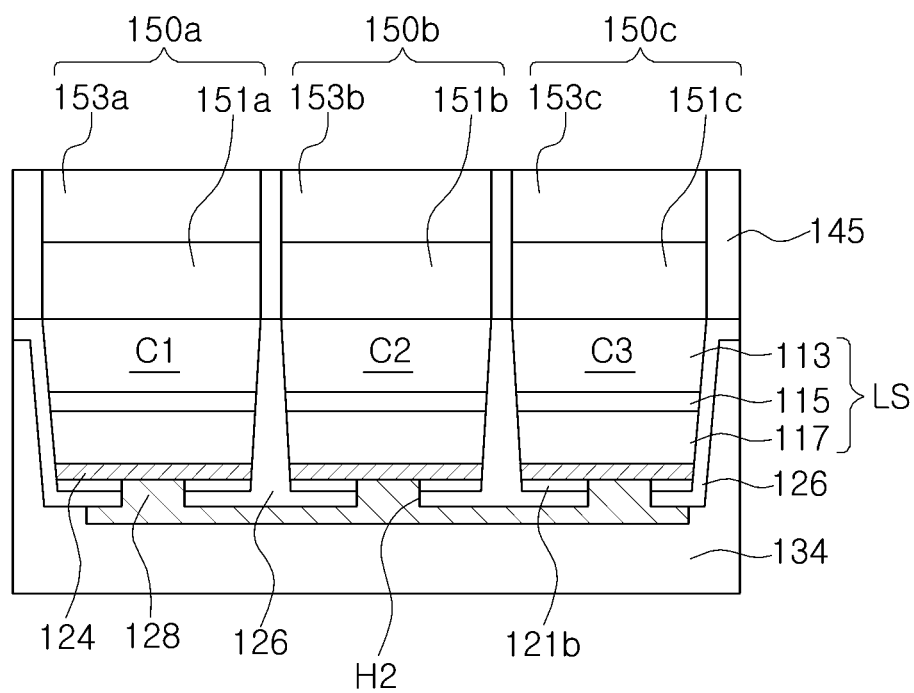

FIGS. 1A and 1B are a plan view and a rear view schematically illustrating a light emitting device package according to an example embodiment. FIGS. 2A and 2B are cross-sectional views of the light emitting device package illustrated in FIG. 1A, taken along lines I-I' and II-II'.

Referring to FIGS. 1 through 2B, a light emitting device package 10 according to an example embodiment may include three light emitting regions C1, C2, and C3, first and second insulating layers 121a and 121b, an isolation insulating layer 126, first contact electrodes 123, first connection electrodes 127, three first electrode pads 131a, 131b, and 131c, a second connection electrode 128, a second electrode pad 132, an encapsulant part 134, three light adjusting layers 150a, 150b, and 150c and a partition 145.

In detail, the light emitting device package 10 may include a light emitting structure LS including a first conductivity-type semiconductor layer 113, an active layer 115, and a second conductivity-type semiconductor layer 117. The light emitting structure LS may be divided into three light emitting regions C1, C2, and C3 by the isolation insulating layer 126. The light emitting structure LS may have a first surface provided by the first conductivity-type semiconductor layer 113 and a second surface provided by the second conductivity-type semiconductor layer 117 and opposite to the first surface. The first surface is opposite to a surface provided by the first conductivity-type semiconductor 113 facing the active layer 115, and the second surface is opposite to a surface provided by the second conductivity-type semiconductor 117 facing the active layer 115.

The isolation insulating layer 126 may extend from the first surface to the second surface to divide the light emitting structure LS into three light emitting regions C1, C2, and C3, and form a continuous structure with respect to the light emitting regions C1, C2, and C3. The isolation insulating layer 126 also extends below a bottom of each of the light emitting regions C1, C2, and C3. One surface of the isolation insulating layer 126 may be coplanar with the first surface.

The active layers 115 of first to third light emitting regions C1, C2, and C3 may emit light having the same wavelength.

For example, the active layers 115 may emit blue lights with 440 nm-460 nm wavelength or ultraviolet (UV) lights with 380 nm-440 nm wavelength.

The light emitting device package 10 may include three first connection electrodes 127 respectively provided in the first to third light emitting regions C1, C2, and C3 and connected to the first conductivity-type semiconductor layers 113 in the light emitting regions C1, C2, and C3, respectively. Each of the first connection electrodes 127 is formed to penetrate through the second conductivity-type semiconductor layer 117 and the active layer 115 to be connected to the first conductivity-type semiconductor layer 113 in each of the light emitting regions C1, C2, and C3.

The light emitting device package 10 may also include the first contact electrodes 123 disposed between the first conductivity-type semiconductor layers 113 and the first connection electrodes 127, respectively, the first electrode pads 131a, 131b, and 131c disposed on the first connection electrodes 127 and provided by the number equal to the number of the light emitting regions C1, C2, and C3, respectively, the second connection electrode 128 commonly connected to the second conductivity-type semiconductor layers 117 of the first to third light emitting regions C1, C2, and C3, the second contact electrodes 124 disposed between the second conductivity-type semiconductor layers 117 and the second connection electrode 128, respectively, and the second electrode pad 132 disposed in the same direction as that of the first electrode pads 131a, 131b, and 131c, and provided on the second connection electrode 128.

The first connection electrode 127 connected to the second light emitting region C2 disposed at the center may have a portion extending to cover a portion of the neighboring third light emitting region C3, and the first electrode pad 131b may be provided on the extended portion. The second connection electrode 128 may be integrally disposed across the first to third light emitting regions C1, C2, and C3. The first connection electrodes 127 may be connected through first through holes H1 in the insulating layers 121b and 126 to the first conductivity-type semiconductor layer 113. The second connection electrode 128 may be connected through second through holes H2 in the insulating layers 121b and 126 to the second conductivity-type semiconductor layers 117. The first electrode pads 131a, 131b, and 131c, and the second electrode pad 132 may be disposed on the second surface of the light emitting structure LS. The first electrode pads 131a, 131b, and 131c, and the second electrode pad 132 may be disposed to be adjacent to vertices of the second surface of the light emitting structure LS.

The first conductivity-type semiconductor layer 113 may be an n-type semiconductor layer, the second conductivity-type semiconductor layer 117 may be a p-type semiconductor layer, and the second electrode pads 132 may be a common anode connected to p-type semiconductor layers of the first to third light emitting regions C1, C2, and C3. Alternatively, in an example embodiment, the first conductivity-type semiconductor layer 113 may be a p-type semiconductor layer, the second conductivity-type semiconductor layer 117 may be an n-type semiconductor layer, and the second electrode pad 132 may be a common cathode connected to n-type semiconductor layers of the first to third light emitting regions C1, C2, and C3.

The light emitting device package 10 may include the first and second insulating layers 121a and 121b electrically insulating the first connection electrodes 127 from the second conductivity-type semiconductor layers 117 and the active layers 115, the encapsulant part 134 surrounding the light emitting structure LS, the first electrode pads 131a, 131b, and 131c, and the second electrode pad 132, and exposing end portions of the first electrode pads 131a, 131b, and 131c, and the second electrode pad 132, wavelength conversion layers 151a, 151b, and 151c provided on the first to third light emitting regions C1, C2, and C3 and respectively converting a wavelength of light emitted from the first to third light emitting regions C1, C2, and C3, the filter layers 153a, 153b, and 153c provided on the wavelength conversion layers 151a, 151b, and 151c and selectively blocking light emitted from at least one of the first to third light emitting regions C1, C2, and C3, and the partition 145 disposed between the wavelength conversion layers 151a, 151b, and 151c and between the filter layers 153a, 153b, and 153c.

The partition 145 may be disposed on the isolation insulating layer 126 in such a manner that it is connected to the isolation insulating layer 126. The partition 145 may also form a continuous structure with respect to the wavelength conversion layers 151a, 151b, and 151c and the filter layers 153a, 153b, and 153c like the isolation insulating layer 126 forming a continuous structure with respect to the light emitting regions C1, C2, and C3. The partition 145 may be formed such that a portion of the isolation insulating layer is inserted into the partition 145. The partition 145 may include a light blocking material, so that lights emitted through the wavelength conversion layers 151a, 151b, and 151c do not interfere with one another. For example, the partition 145 may include a silicon (Si), a black matrix resin or the like. The first wavelength conversion layer 151a and the first filter layer 153a may form the first light adjusting layer 150a, the second wavelength conversion layer 151b and the second filter layer 153b may form the second light adjusting layer 150b, and the third wavelength conversion layer 151c and the third filter layer 153c may form the third light adjusting layer 150c.

In a case where the first to third light emitting regions C1, C2, and C3 emit ultraviolet (UV) light, the first wavelength conversion layer 151a includes a red phosphor, the second wavelength conversion layer 151b includes a green phosphor, and the third wavelength conversion layer 151c includes a blue phosphor, the filter layers 153a, 153b, and 153c may selectively block UV light emitted from the first to third light emitting regions C1, C2, and C3, and allow red light, green light, and blue light emitted from the wavelength conversion layers 151a, 151b, and 151c to be transmitted therethrough.

Alternatively, in a case where the first to third light emitting regions C1, C2, and C3 emit blue light, the first wavelength conversion layer 151a includes a red phosphor, the second wavelength conversion layer 151b includes a green phosphor, and the third wavelength conversion layer 151c includes a green phosphor having a concentration less than that of the second wavelength conversion layer 151b, the first and second filter layers 153a and 153b may selectively block blue light emitted from the first and second light emitting regions C1 and C2 and allow red light and green light emitted from the first and second wavelength conversion layers 151a and 151b to be transmitted therethrough. The third filter layer 153c may allow blue light emitted from the third light emitting region C3 to be transmitted therethrough.

Also, the filter layers 153a, 153b, and 153c may selectively block a predetermined wavelength region of light emitted from the plurality of wavelength conversion layers 151a, 151b, and 151c, and thus, a full width at half maximum (FWHM) of light emitted from the wavelength conversion layers 151a, 151b, and 151c may be reduced. The wavelength conversion layers 151a, 151b, and 151c may include various combinations of phosphors without being limited to the example embodiments described above.

FIGS. 3A through 9B are cross-sectional views illustrating a method of manufacturing the light emitting device package 10 according to an example embodiment. In detail, the method of manufacturing the light emitting device package 10 relates to a method of manufacturing a wafer-level chip-scale package. Hereinafter, some cross-sections of a substrate (or wafer) will be magnified to be illustrated to help understanding in major process drawings. FIGS. 3A through 9A are cross-sectional views taken along line I-I' of FIG. 1A, and FIGS. 3B through 9B are cross-sectional views taken along line II-II' of FIG. 1A.

Figure 3A:
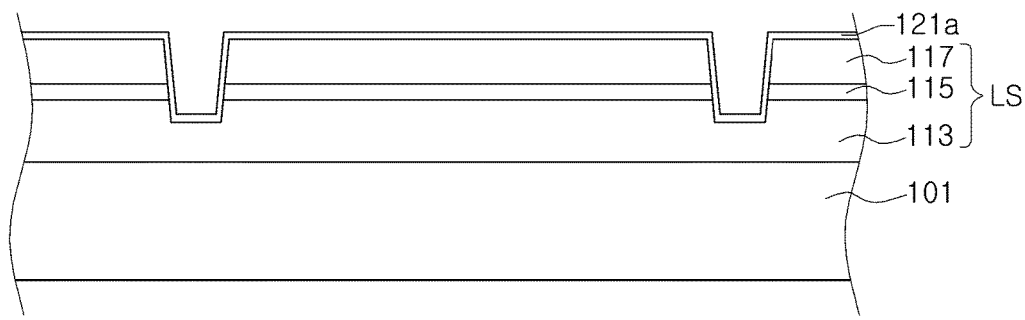
FIGS. 3A through 9B are cross-sectional views illustrating a major process of a method of manufacturing a light emitting device package according to an example embodiment.
Figure 3B:
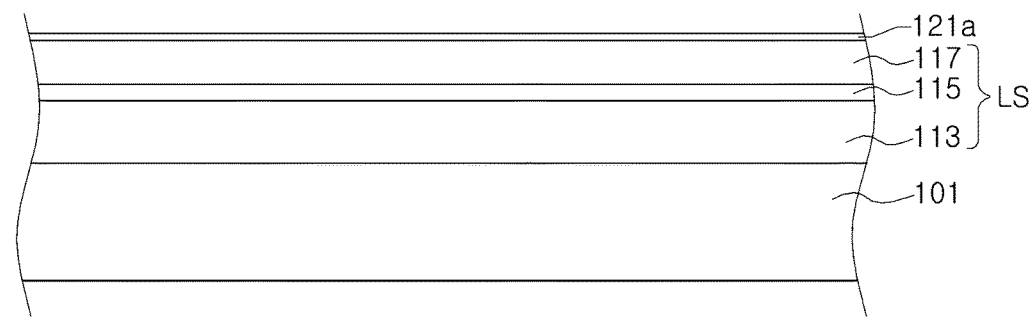

Referring to FIGS. 3A and 3B, the method of manufacturing the light emitting device package 10 may start with an operation of preparing a substrate 101 on which a light emitting structure LS including a first conductivity-type semiconductor layer 113, an active layer 115, and a second conductivity-type semiconductor layer 117 is formed.

The substrate 101 may be an insulating substrate, a conductive substrate, or a semiconductor substrate, as necessary. For example, the substrate 101 may be formed of sapphire, SiC, Si, $MgAl_2O_4$, MgO, $LiAlO_2$, $LiGaO_2$, or GaN.

The light emitting structure LS may be an epitaxial layer of a Group III nitride-based semiconductor layer formed on the substrate 101. The first conductivity-type semiconductor layer 113 may be a nitride semiconductor satisfying n-type $In_xAl_yGa_{1-x-y}N$, where $0 \leq x < 1$, $0 \leq y < 1$, and $0 \leq x+y < 1$, and an n-type impurity may be Si, Ge, Se, or Te. The active layer 115 may have a multi-quantum well (MQW) structure in which quantum well layers and quantum barrier layers are alternately stacked. For example, the quantum well layers and the quantum barrier layers may be formed of $In_xAl_yGa_{1-x-y}N$, where $0 \leq x \leq 1$, $0 \leq y \leq 1$, and $0 \leq x+y \leq 1$, having different compositions. In a specific example, the quantum well layers may be formed of $In_xGa_{1-x}N$, where $0 \leq x \leq 1$, and the quantum barrier layers may be formed of GaN or AlGaN. The second conductivity-type semiconductor layer 117 may be a nitride semiconductor layer satisfying p-type $In_xAl_yGa_{1-x-y}N$, where $0 \leq x < 1$, $0 \leq y < 1$, and $0 \leq x+y < 1$, and a p-type impurity may be Mg, Zn, or Be. A buffer layer may be formed between the substrate 101 and the first conductivity-type semiconductor layer 113. The buffer layer may be formed of $In_xAl_yGa_{1-x-y}N$, where $0 \leq x < 1$, and $0 \leq y \leq 1$. For example, the buffer layer may be formed of AlN, AlGaN, or InGaN. As required, the buffer layer may be formed by combining a plurality of layers having different compositions, or may be formed of a single layer in which compositions are gradually changed.

Thereafter, portions of the second conductivity-type semiconductor layer 117 and the active layer 115 are removed to form an opening so that a portion of the first conductivity-type semiconductor layer 113 is exposed, and a first insulating layer 121a may subsequently be deposited. One or a plurality of openings may be formed in each light emitting region.

Figure 4A:
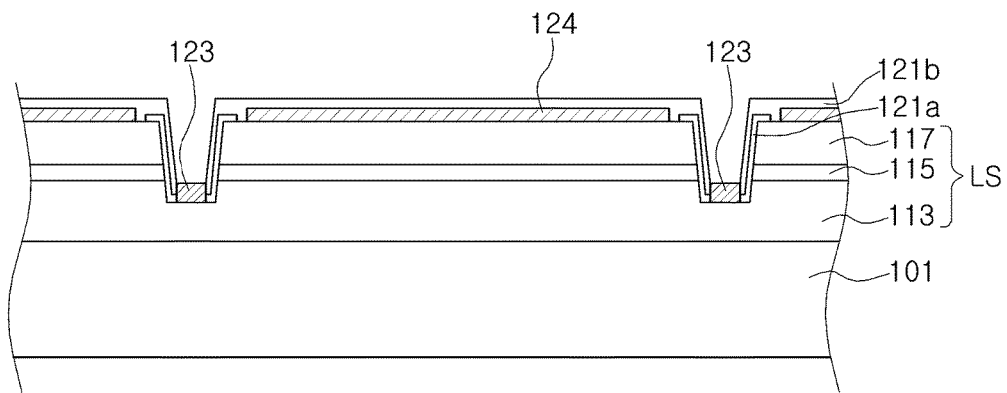
Figure 4B:
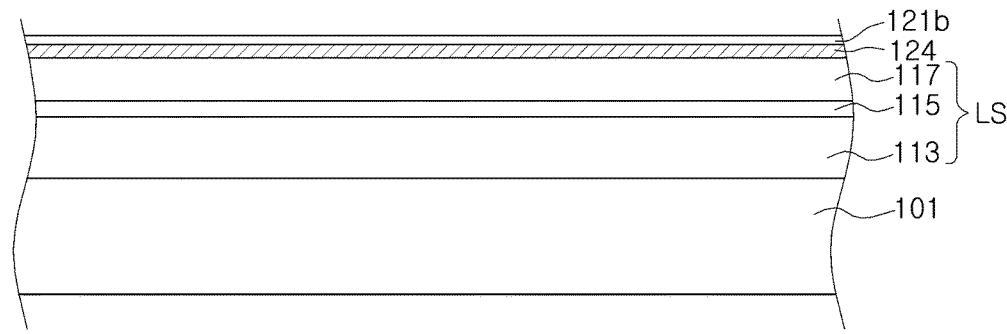

Referring to FIGS. 4A and 4B, first and second contact electrodes 123 and 124 formed of a conductive material may be formed on a portion of the first insulating layer 121a from which the portion of the first insulating layer 121a has been removed.

First, the portion of the first insulating layer 121a formed on the second conductivity-type semiconductor layer 117 is removed, and the second contact electrode 124 may be formed to be electrically connected to the second conductivity-type semiconductor layer 117. Next, a second insulating layer 121b covering the second contact electrode 124 and the first insulating layer 121a may be formed. Thereafter, portions of the first and second insulating layers 121a and 121b within the opening may be removed, and a first contact electrode 123 may be formed on the first conductivity-type semiconductor layer 113 within the opening so that the first contact electrode 123 is electrically connected to the first conductivity-type semiconductor layer 113.

The first and second contact electrodes 123 and 124 may be reflective electrodes including at least one of Ag, Al, Ni, Cr, Cu, Au, Pd, Pt, Sn, W, Rh, Ir, Ru, Mg, Zn, and an alloy including these elements.

Figure 5A:
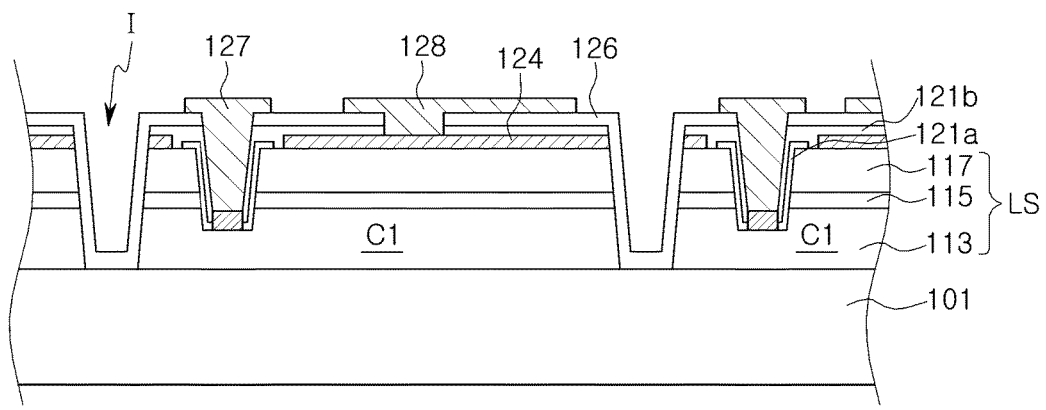
Figure 5B:
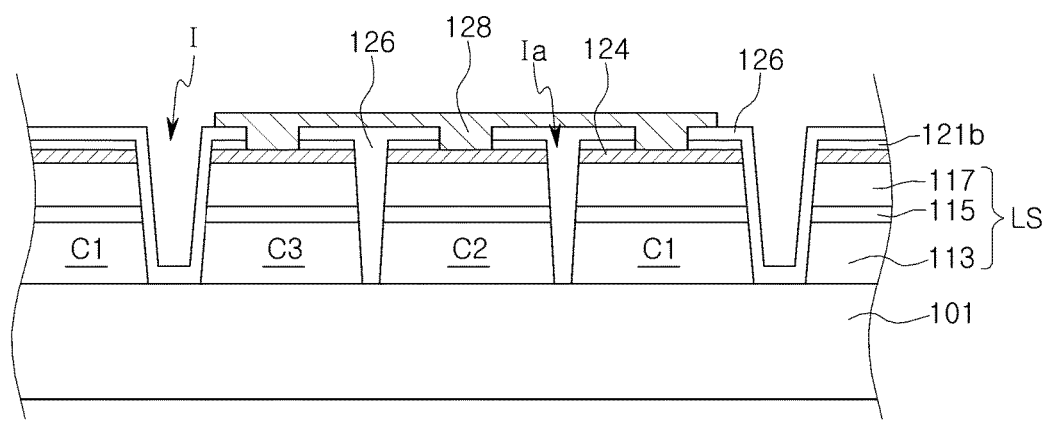

Referring to FIGS. 5A and 5B, an isolation process of dividing the light emitting structure LS into a plurality of light emitting regions and a process of forming a first connection electrode and a second connection electrode may be performed.

Referring to FIG. 5A, an isolation region I may be formed to penetrate through the second insulating layer 121b, the second contact electrode 124, and the light emitting structure LS between the first contact electrode 123 and the second contact electrode 124. Through such a process, the light emitting structure LS may be divided into a plurality of light emitting regions and supported by the substrate 101.

Referring to FIG. 5B, the isolation region I may be formed in every three light emitting regions C1, C2, and C3. The light emitting structure LS may be divided into individual light emitting chips by the isolation region I. A sub-isolation region Ia may be formed between three light emitting regions C1, C2, and C3. The isolation process may be provided as a process of forming the isolation region I using a blade, but is not limited thereto. The sub-isolation region Ia may be formed through an additional process or may be formed through the same process as that of the isolation region I. The sub-isolation region Ia may be formed to be narrower than the isolation region I.

The light emitting regions C1, C2, and C3 obtained through the isolation process may have trapezoid shapes. Thus, the light emitting regions C1, C2, and C3 may have side surfaces sloped with respect to an upper surface of the substrate 101.

Subsequently, an isolation insulating layer 126 may be formed on the side surfaces of the light emitting regions C1, C2, and C3 and on the second insulating layer 121b. In FIG. 5B, it is illustrated that the sub-isolation region Ia is filled with the isolation insulating layer 126, but is not limited thereto.

The isolation insulating layer 126 may be formed of any material as long as it has electrically insulating properties, and a material having low light absorption may be used. The isolation insulating layer 126 may include, for example, a silicon oxide, a silicon oxynitride, or a silicon nitride. In an example embodiment, the isolation insulating layer 126 may include light reflective materials and have a light reflective structure. The isolation insulating layer 126 may have a multilayer reflective structure in which a plurality of insulating layers having different refractive indices are alternately stacked. The multilayer reflective structure may be a distributed Bragg reflector (DBR) in which a first insulating layer having a first refractive index and a second insulating layer having a second refractive index are alternatively stacked. The multilayer reflective structure may be a structure in which a plurality of insulating layers having different refractive indices are repeatedly stacked two to one hundred times. For example, a plurality of insulating layers having different refractive indices may be repeatedly stacked three to seventy times, and preferably, but not necessarily, four to fifty times. The plurality of insulating layers of the multi-layer reflective structure may each be an oxide or a nitride such as $SiO_2$, SiN, $SiO_xN_y$, $TiO_2$, $Si_3N_4$, $Al_2O_3$, $ZrO_2$, TiN, AlN, TiAlN, TiSiN, or combinations thereof.

Thereafter, portions of the isolation insulating layer 126 and the second insulating layer 121b may be removed so that portions of the first and second contact electrodes 123 and 124 are exposed through first through holes H1 and second through holes H2. A first connection electrode 127 connected to the exposed first contact electrode 123 and a second connection electrode 128 connected to the second contact electrode 124 may be formed. The first connection electrode 127 may be formed in each of the light emitting regions, and the second connection electrode 128 may be integrally formed across three light emitting regions.

Figure 6A:
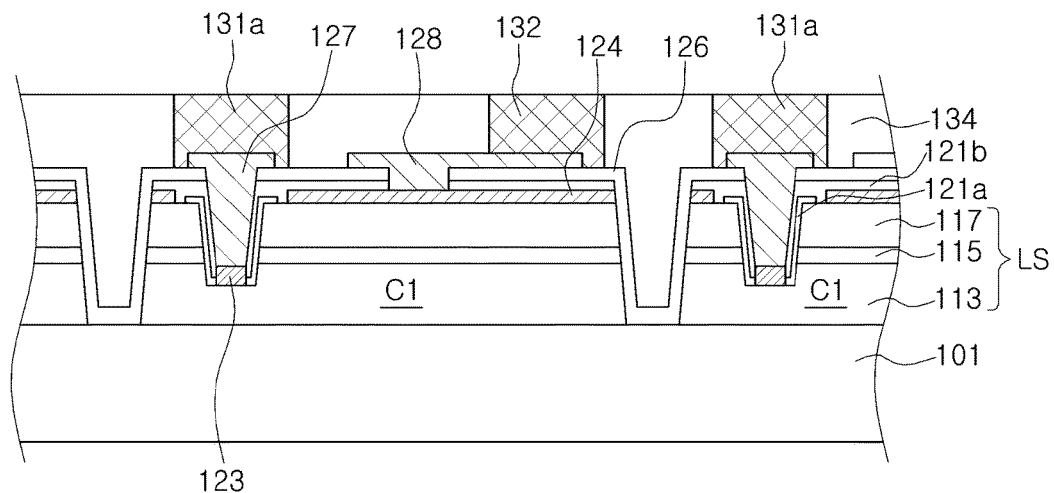
Figure 6B:
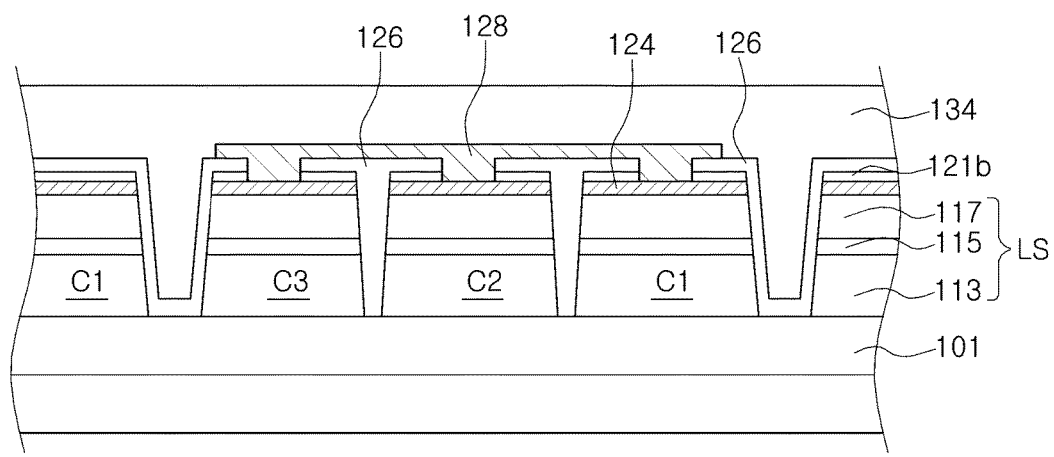

Referring to FIGS. 6A and 6B, a first electrode pad 131a connected to the first connection electrode 127 and a second electrode pad 132 connected to the second connection electrode 128 may be formed. The first electrode pad 131a and the second electrode pad 132 may be formed through a plating process. The first electrode pad 131a and the second electrode pad 132 may be formed of copper (Cu). However, a material of the first electrode pad 131a and the second electrode pad 132 is not limited thereto, and the first electrode pad 131a and the second electrode pad 132 may be formed of a conductive material other than copper (Cu).

An encapsulant part 134 may be formed between the first electrode pad 131a and the second electrode pad 132 to fill the isolation region I (refer to FIGS. 6A and 6B). The encapsulant part 134 may be formed through a process of applying a molding material to cover upper surfaces of the first electrode pad 131a and the second electrode pad 132 and a process of exposing end portions of the first electrode pad 131a and the second electrode pad 132 using a planarization method such as grinding, or the like. In order to support the light emitting structure LS, the encapsulant part 134 has a high Young's modulus, and in order to dissipate heat generated by the light emitting structure, the encapsulant part 134 may be formed of a material having high heat conductivity. The encapsulant part 134 may be formed of an epoxy resin or a silicone resin, for example. Also, the encapsulant part 134 may include light-reflective particles for reflecting light. The light-reflective particles may be formed of titanium dioxide ($TiO_2$) and/or an aluminum oxide ($Al_2O_3$), but a material thereof is not limited thereto.

Figure 7A:
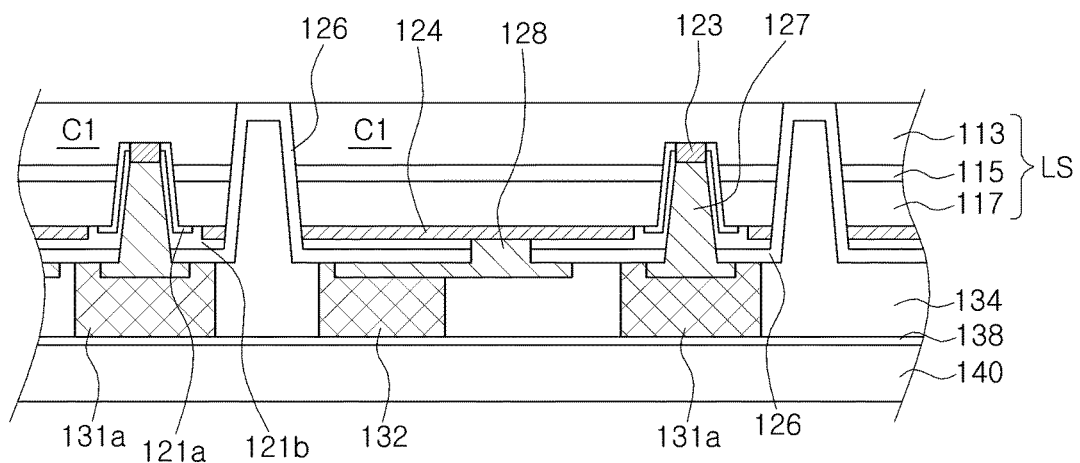
Figure 7B:
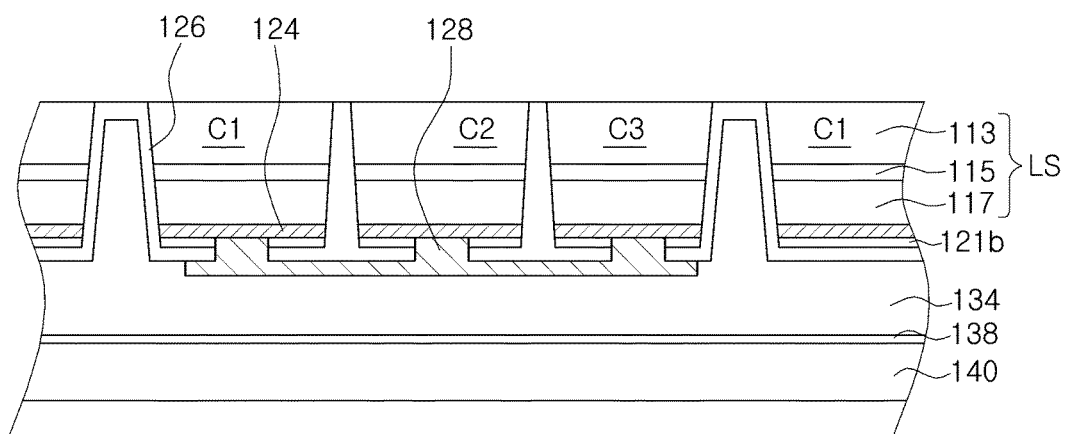

Referring to FIGS. 7A and 7B, a process of removing the substrate 101 may be performed so that the first conductivity-type semiconductor layer 113 and the isolation insulating layer 126 are exposed.

A support substrate 140 may be attached to the encapsulant part 134. A bonding layer 138 such as a UV-curing material may be used for the purpose of bonding the support substrate 140. Thereafter, in a case where the substrate 101 is a transparent substrate such as sapphire, the substrate 101 may be separated from the light emitting structure LS through laser lift-off (LLO). A laser used in the LLO process may be at least any one of a 193 excimer laser, a 248 excimer laser, a 308 excimer laser, an Nd:YAG laser, a He—Ne laser, and an Ar ion laser. Also, in a case where the substrate 101 is an opaque substrate such as silicon (Si), the substrate 101 may be removed through grinding, polishing, dry etching, or any combinations thereof.

If necessary, concave and convex structures may be formed on an upper surface of the first conductivity-type semiconductor layer 113 in order to increase light emission efficiency. The concave and convex structures may be formed through a wet etching method using a solution including KOH or NaOH or a dry etching method using an etchant gas including a $BCl_3$ gas.

Figure 8A:
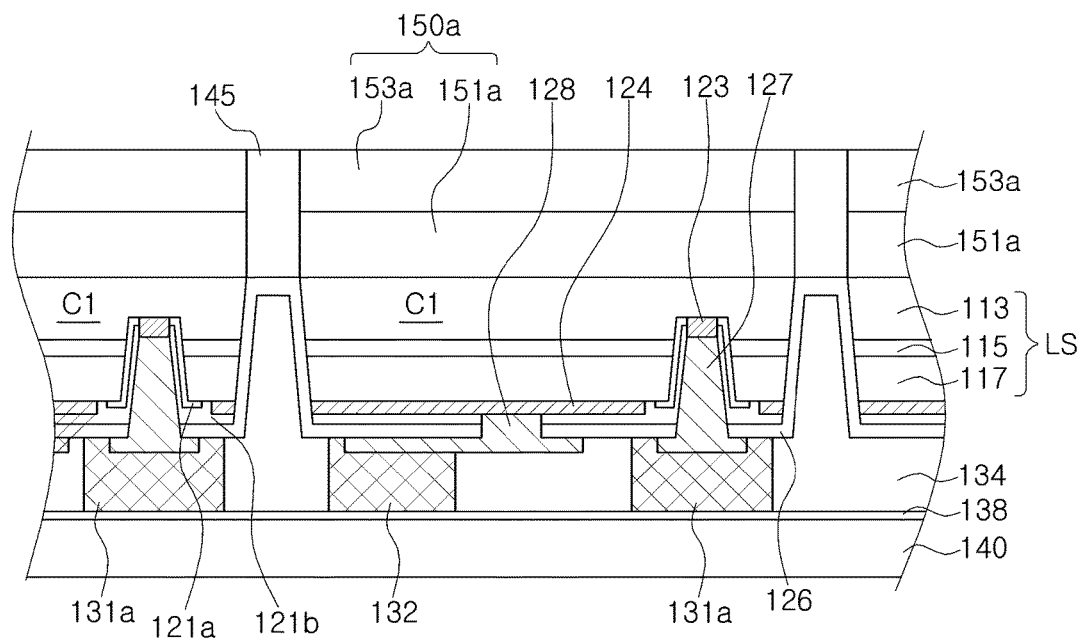
Figure 8B:
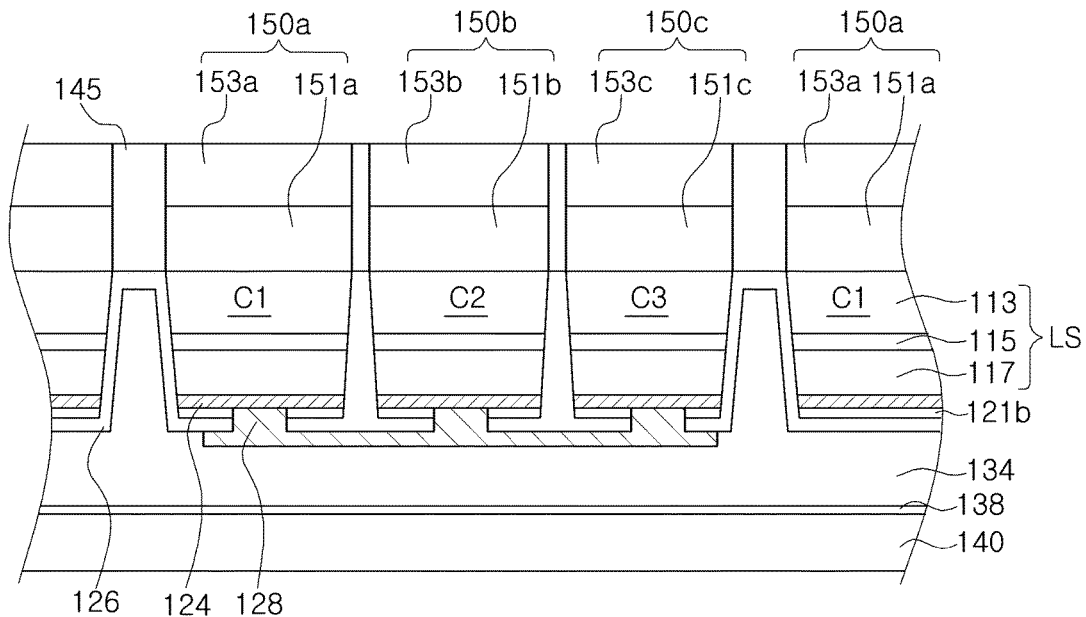

Referring to FIGS. 8A and 8B, a partition 145 may be formed between the light emitting regions. Also, wavelength conversion layers 151a, 151b, and 151c, and filter layers 153a, 153b, and 153c may be sequentially formed on the first conductivity-type semiconductor layer 113.

The wavelength conversion layers 151a, 151b, and 151c may include various wavelength conversion materials such as a phosphor or a quantum dot. The wavelength conversion layers 151a, 151b, and 151c may include different phosphors to emit light in different colors.

Figure 9A:
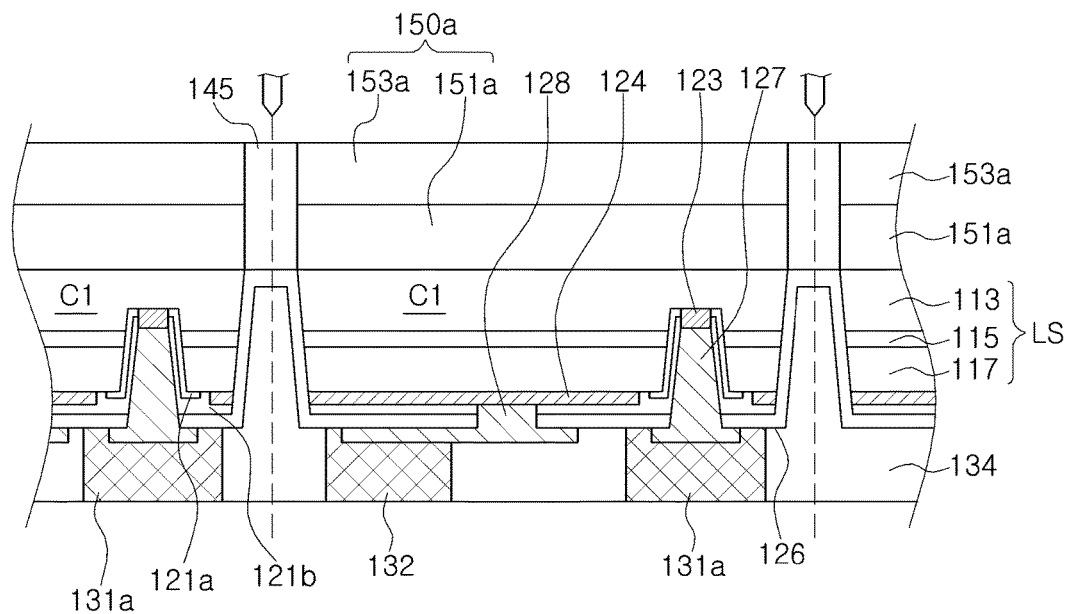
Figure 9B:
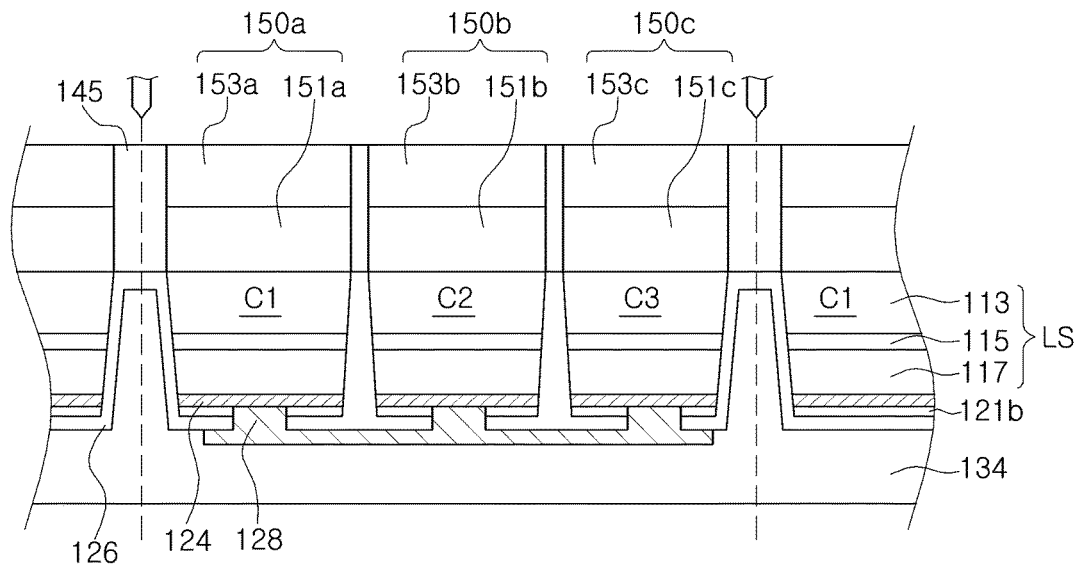

Referring to FIGS. 9A and 9B, the resultant structure is finally cut to individual packages. The cutting process may be performed in such a manner that the support substrate 140 is removed, an adhesive tape is attached, and the resultant structure is divided into individual packages through a blade cutting method.

A chip scale package obtained through the foregoing process may have a package size substantially at the same level as that of a semiconductor light emitting device (that is, an LED chip). Thus, when the package is used in a lighting device, a high amount of light per unit area may be obtained. When the package is used in a display panel, a pixel size and a pixel pitch may be reduced. Also, since every process is performed at a wafer level, the manufacturing method is appropriate for mass-production, and an optical structure including a wavelength conversion layer and/or a filter layer may be advantageously integrally formed with an LED chip.

Figure 10A:
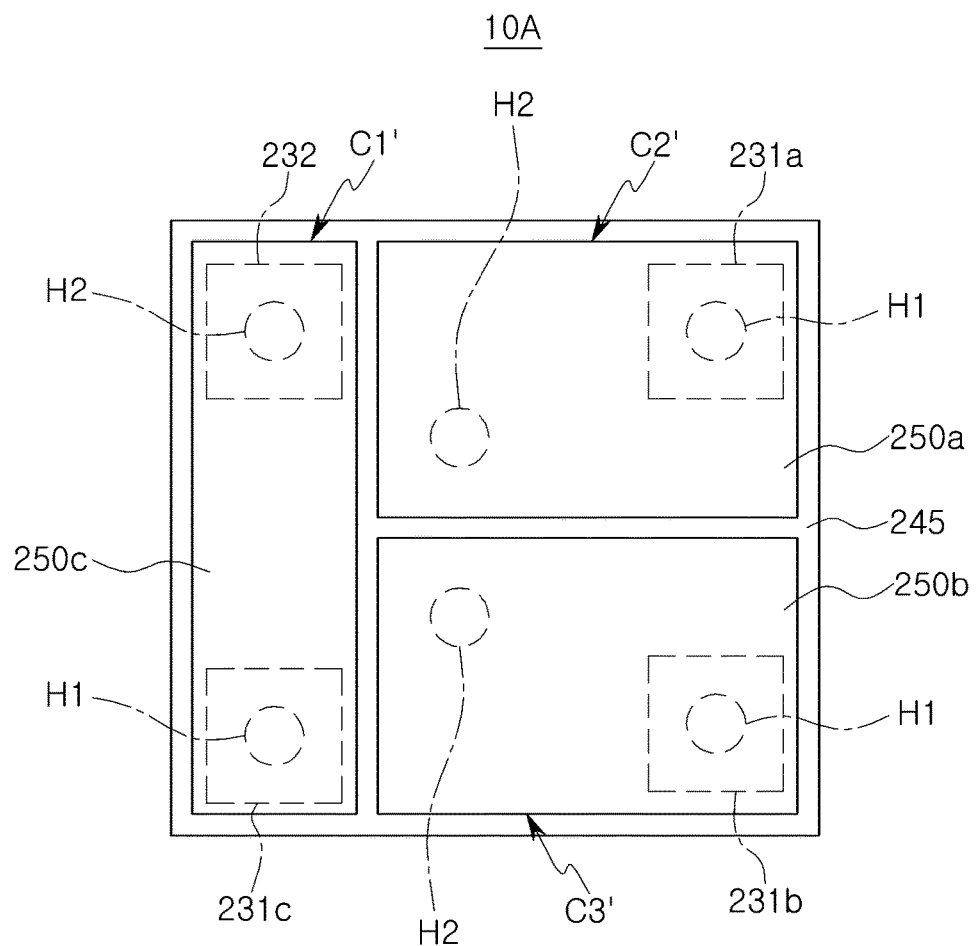
FIGS. 10A and 10B are a plan view and a rear view schematically illustrating a light emitting device package according to an example embodiment.
Figure 10B:
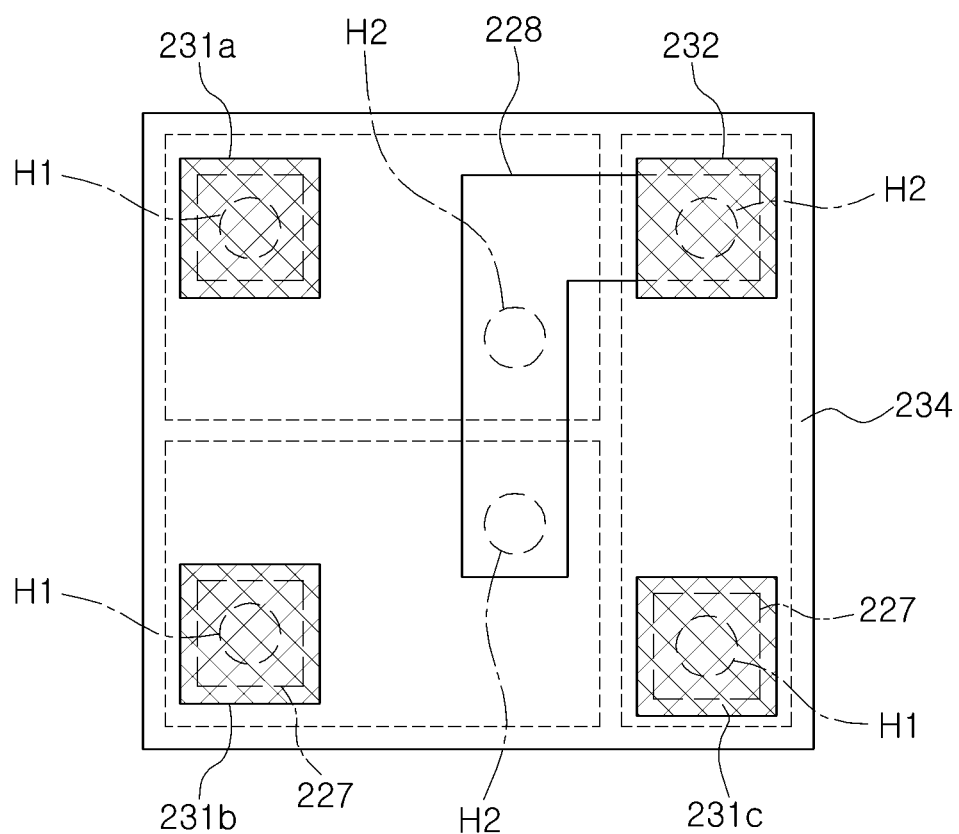

FIGS. 10A and 10B are a plan view and a rear view schematically illustrating a light emitting device package according to an example embodiment.

The light emitting device package 10A illustrated in FIGS. 10A and 10B are different from the light emitting device package 10 described above with reference to FIGS. 1A though 2B only in a layout structure of a plurality of light emitting regions C1', C2', and C3', and thus, it will be described briefly.

Referring to FIGS. 10A and 10B, the light emitting device package 10A according to an example embodiment may include a light emitting structure divided into three light emitting regions C1', C2', and C3'. The first light emitting region C1' may be disposed in one direction, and the second and third light emitting regions C2' and C3' may be disposed to be parallel to each other in a direction substantially perpendicular to a longer side of the first light emitting region C1'.

The light emitting device package 10A may include first connection electrodes 227, three first electrode pads 231a, 231b, and 231c, a second connection electrode 228, a second electrode pad 232, an encapsulant part 234, three light adjusting layers 250a, 250b, and 205c, and a partition 245. Each of the three light adjusting layers 250a, 250b, and 205c may include wavelength conversion layer and filter layer. The first connection electrodes 227 may be connected through first through holes H1 to first conductivity-type semiconductor layers. The second connection electrode 228 may be connected through second through holes H2 to second conductivity-type semiconductor layers. The first electrode pad 231c and the second electrode pad 232 may be disposed below the first light emitting region C1', the first electrode pad 231a may be disposed below the second light emitting region C2', and the first electrode pad 231b may be disposed below the third light emitting region C3'.

Figure 11A:
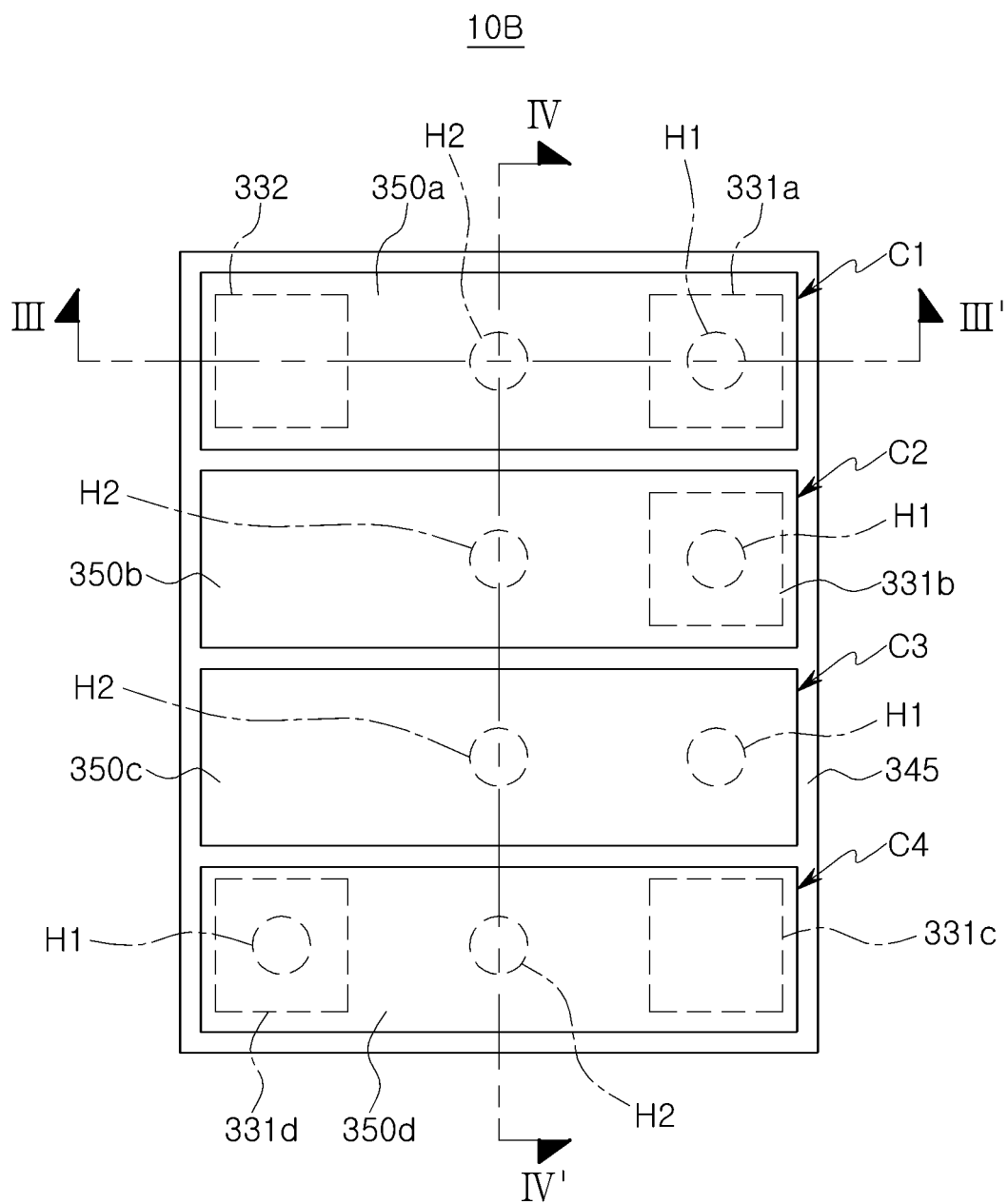
FIGS. 11A and 11B are a plan view and a rear view schematically illustrating a light emitting device package according to an example embodiment.
Figure 11B:
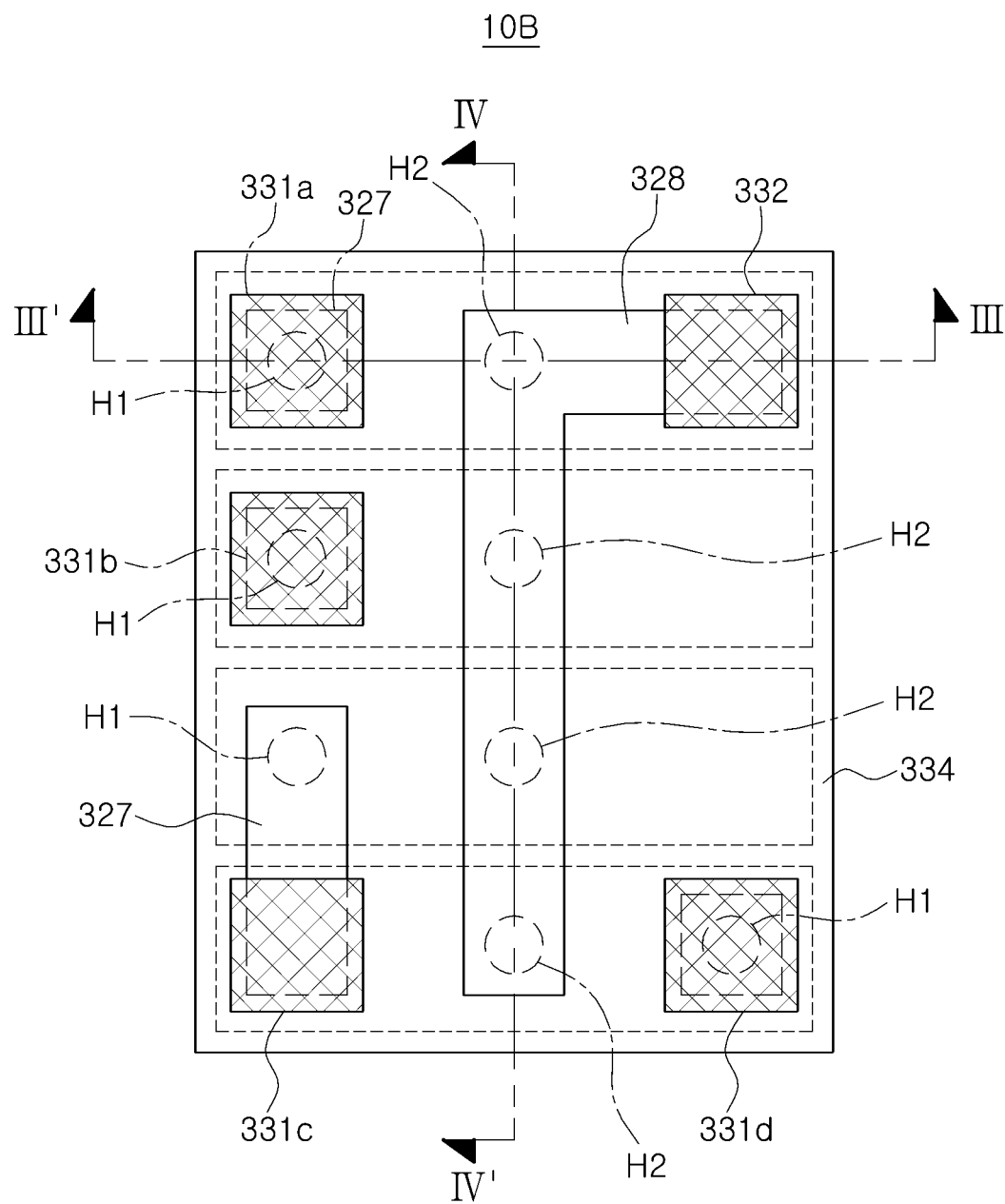
Figure 12A:
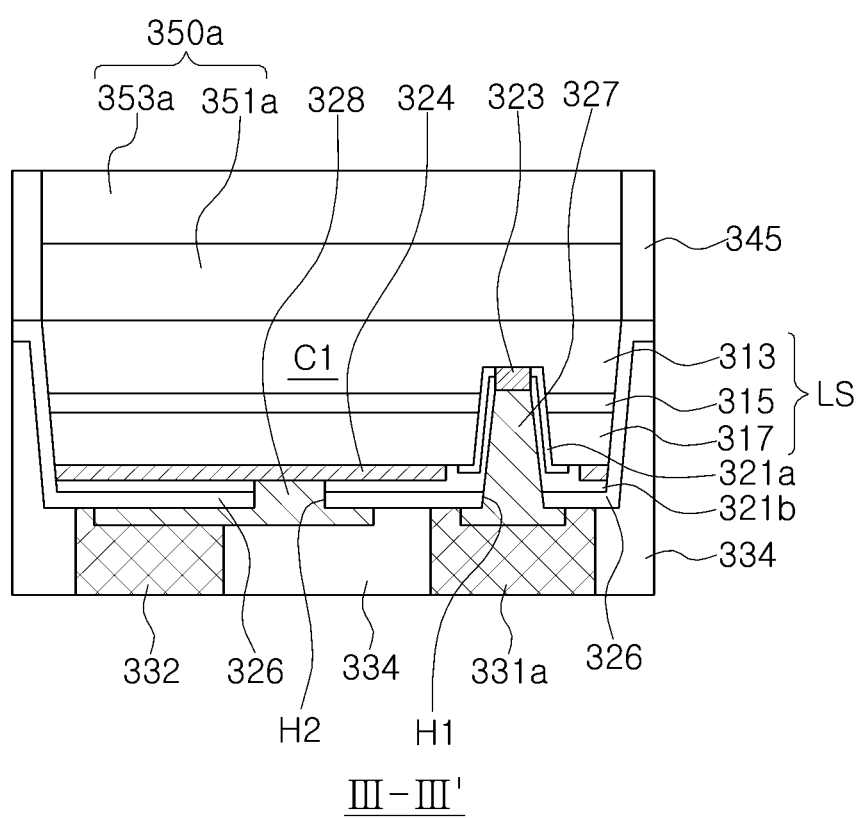
FIGS. 12A and 12B are cross-sectional views of the light emitting device package illustrated in FIG. 11A, taken along lines III-III' and IV-IV'.
Figure 12B:
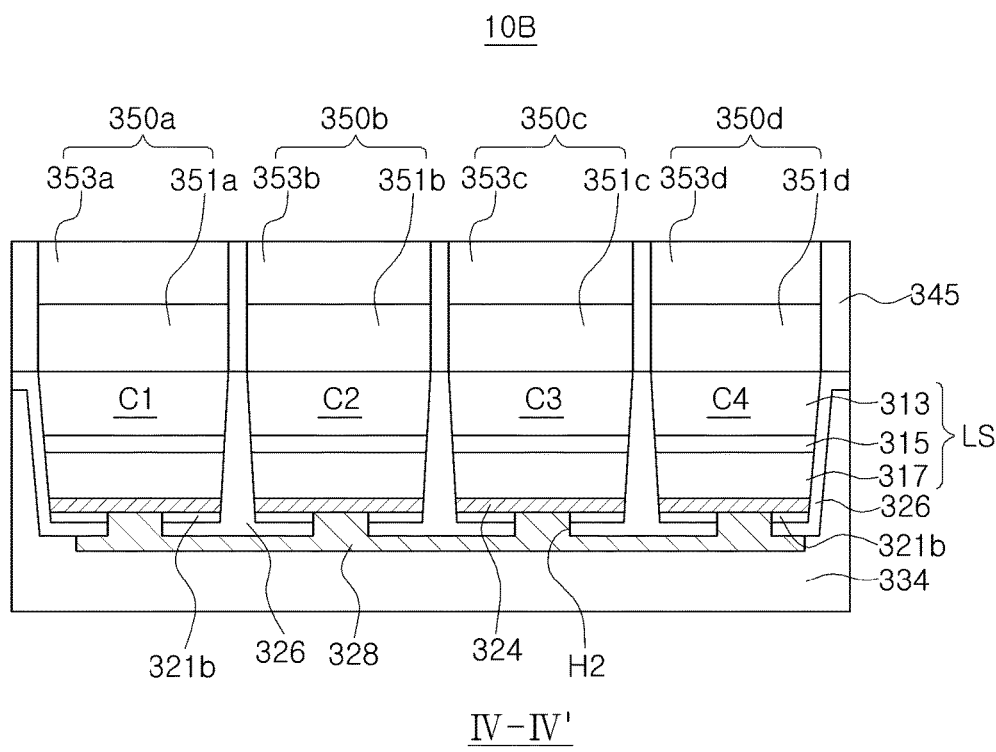

FIGS. 11A and 11B are a plan view and a rear view schematically illustrating a light emitting device package 10B according to an example embodiment. FIGS. 12A and 12B are cross-sectional views of the light emitting device package 10B illustrated in FIG. 11A, taken along lines III-III' and IV-IV'. The light emitting device package 10B illustrated in FIGS. 11A through 12B has a structure including light emitting regions different from the number of light emitting regions of the light emitting device package 10 described above with reference to FIGS. 1A through 2B, and thus, the light emitting device package 10B illustrated in FIGS. 11A through 12B will be described briefly. The descriptions of the light emitting device package 10 described above with reference to FIGS. 1A through 2B may be applied in the same manner to the present example embodiment unless they contradict.

Referring to FIGS. 11A through 12B, the light emitting device package 10B according to an example embodiment may include four light emitting regions C1, C2, C3, and C4, first and second insulating layers 321a and 321b, an isolation insulating layer 326, first contact electrodes 323, first connection electrodes 327, first electrode pads 331a, 331b, 331c, and 331d, second contact electrodes 324, a second connection electrode 328, a second electrode pad 332, an encapsulant part 334, four light adjusting layers 350a, 350b, 350c, and 350d, and a partition 345.

In detail, the light emitting device package 10B may include a light emitting structure LS including a first conductivity-type semiconductor layer 313, an active layer 315, and a second conductivity-type semiconductor layer 317. The light emitting structure LS may be divided into four light emitting regions C1, C2, C3, and C4 by an isolation insulating layer 326.

The light emitting device package 10B may include four first connection electrodes 327 respectively provided in each of the light emitting regions C1, C2, C3, and C4, and connected to the first conductivity-type semiconductor layers 313 by penetrating through the second conductivity-type semiconductor layers 317 and the active layers 315, first contact electrodes 323 respectively disposed between the first conductivity-type semiconductor layers 313 and the first connection electrodes 327, first electrode pads 331a, 331b, 331c, and 331d respectively disposed on the first connection electrodes 327 and provided by the number equal to the number of the light emitting regions, a second connection electrode 328 commonly connected to the second conductivity-type semiconductor layers 317 of the light emitting regions C1, C2, C3, and C4, second contact electrodes 324 respectively disposed between the second conductivity-type semiconductor layers 317 and the second connection electrode 328, and a second electrode pad 332 disposed in the same direction as that of the first electrode pads 331a, 331b, 331c, and 331d and provided on the second connection electrode 328.

The first connection electrode 327 connected to the light emitting region C3 disposed at an inner side may have a portion extending to cover a portion of the neighboring light emitting region C4, and the first electrode pad 331c may be provided on the extended portion. The second connection electrode 328 may be integrally disposed across four light emitting regions C1, C2, C3, and C4.

The first connection electrodes 327 may be connected through first through holes H1 to the first conductivity-type semiconductor layers 313, respectively. The second connection electrode 328 may be connected through second through holes H2 to the second conductivity-type semiconductor layers 317. The first electrode pads 331a, 331c, and 331d and the second electrode pad 332 may be disposed to be adjacent to a vertex of the light emitting structure LS. The first electrode pad 331b may be disposed to be adjacent to an edge of the light emitting structure LS.

The light emitting device package 10B may include wavelength conversion layers 351a, 351b, 351c, and 351d provided on the light emitting regions C1, C2, C3, and C4 and converting light emitted from the light emitting regions C1, C2, C3, and C4, filter layers 353a, 353b, 353c, and 353d provided on the wavelength conversion layers 351a, 351b, 351c, and 351d and selectively blocking light emitted from at least one of the light emitting regions C1, C2, C3, and C4, and a partition 345 disposed between the wavelength conversion layers 351a, 351b, 351c, and 351d and the filter layers 353a, 353b, 353c, and 353d. The first wavelength conversion layer 351a and the first filter layer 353a may form a first light adjusting layer 350a, the second wavelength conversion layer 351b and the second filter layer 353b may form a second light adjusting layer 350b, the third wavelength conversion layer 351c and the first filter layer 353c may form a third light adjusting layer 350c, and the fourth wavelength conversion layer 351d and the first filter layer 353d may form a fourth light adjusting layer 350d.

The light emitting regions C1, C2, C3, and C4 may emit UV light, and the first wavelength conversion layer 351a may include a red phosphor, the second wavelength conversion layer 351b may include a green phosphor, the third wavelength conversion layer 351c may include a blue phosphor, and the fourth wavelength conversion layer 351d may include phosphors mixed to emit white light. In this case, the filter layers 353a, 353b, 353c, and 353d may selectively block UV light emitted from the light emitting regions C1, C2, C3, and C4, and allow red light, green light, blue light, and white light emitted from the wavelength conversion layers 351a, 351b, 351c, and 351d to be transmitted therethrough. In addition, the filter layers 353a, 353b, 353c, and 353d may selectively block a certain wavelength range of light emitted from the wavelength conversion layers 351a, 351b, 351c, and 351d, and thus, a full width at half maximum of light emitted from the wavelength conversion layers 351a, 351b, 351c, and 351d may be reduced.

Figure 13A:
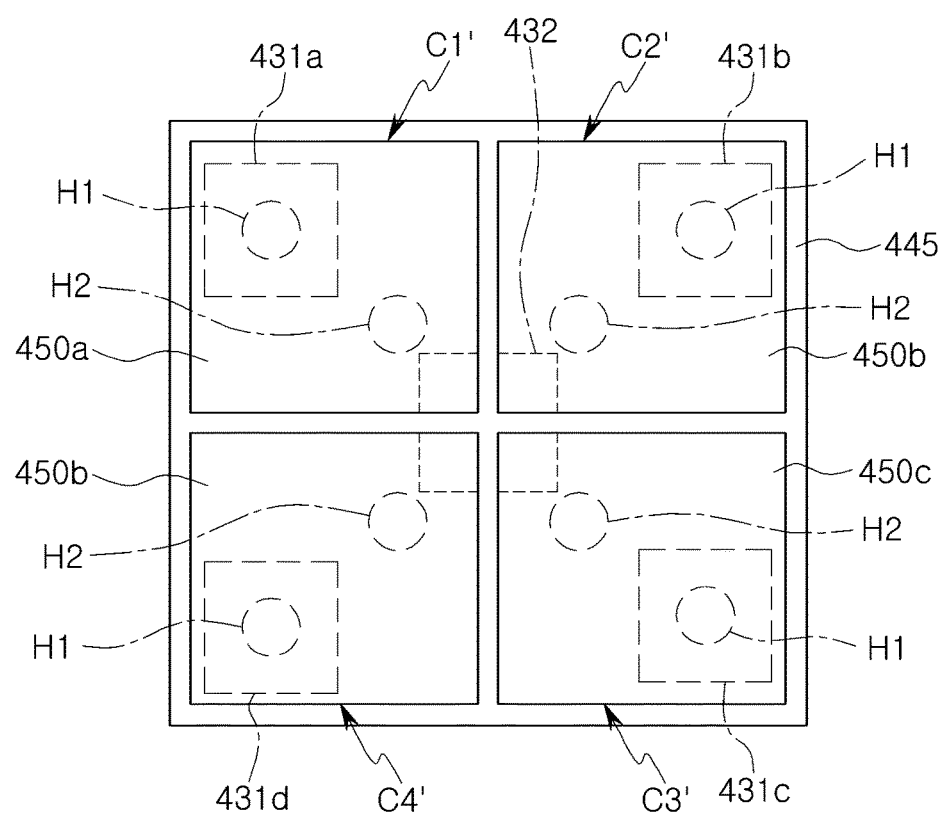
FIGS. 13A and 13B are a plan view and a rear view schematically illustrating a light emitting device package according to an example embodiment.
Figure 13B:
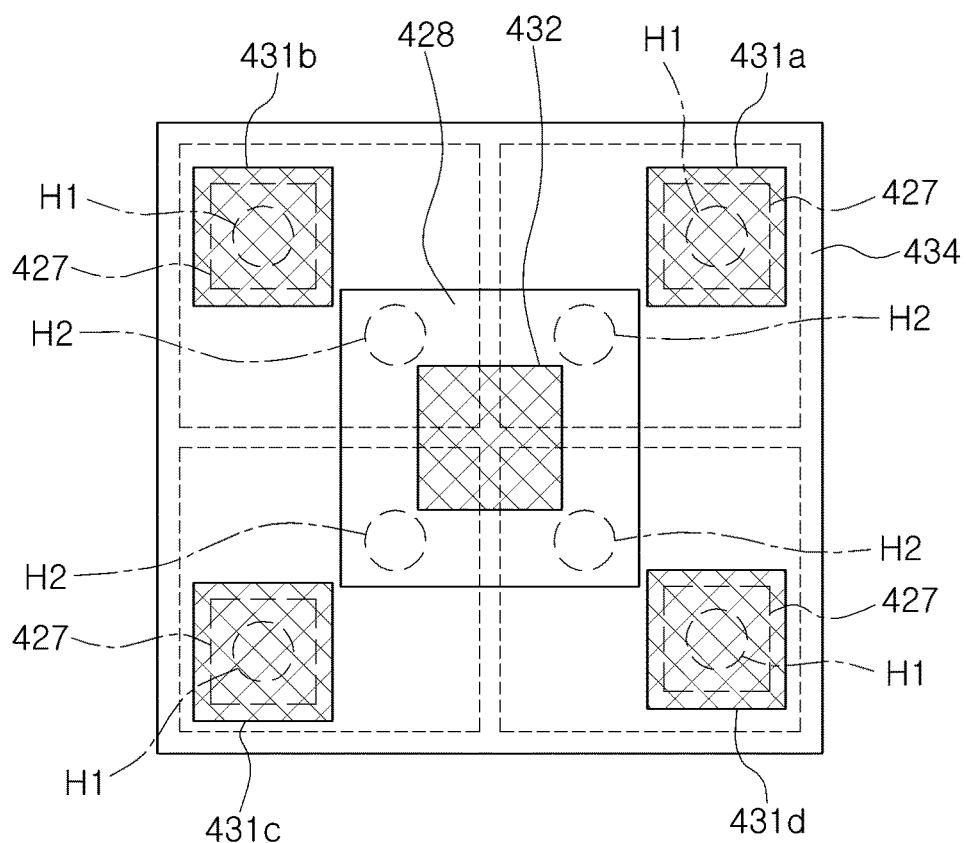

FIGS. 13A and 13B are a plan view and a rear view schematically illustrating a light emitting device package 10C according to an example embodiment. The light emitting device package 10C illustrated in FIGS. 13A and 13B is only different from the light emitting device package 10B described above with reference to FIGS. 11A through 12B in a layout structure of the plurality of light emitting regions C1, C2, C3, and C4, and thus, the light emitting device package 10C illustrated in FIGS. 13A and 13B will be described briefly.

Referring to FIGS. 13A and 13B, the light emitting device package 10C according to an example embodiment may include a light emitting structure divided into four light emitting regions C1, C2, C3, and C4. The four light emitting regions C1, C2, C3, and C4 may be disposed in two rows and two columns.

The light emitting device package 10C may include first connection electrodes 427 respectively disposed in each of the light emitting regions, first electrode pads 431a, 431b, 431c, and 431d disposed on the first connection electrodes 427, respectively, a second connection electrode 428 disposed across the four light emitting regions C1, C2, C3, and C4, a second electrode pad 432 disposed on the second connection electrode 428, an encapsulant part 434, four light adjusting layers 450a, 450b, 450c, and 450d, and a partition 445. Each of the four light adjusting layers 450a, 450b, 450c, and 450d may include wavelength conversion layer and filter layer.

The first connection electrodes 427 may be connected through first through holes H1 to first conductivity-type semiconductor layers, respectively. The second connection electrode 428 may be connected through second through holes H2 to second conductivity-type semiconductor layers. The second electrode pad 432 may be disposed to be at or adjacent to the center of the light emitting structure, and four first electrode pads 431a, 431b, 431c, and 431d may be disposed to be adjacent vertices of the light emitting structure. The first electrode pad 431a may be disposed below the first light emitting region C1', the first electrode pad 431b may be disposed below the second light emitting region C2', the first electrode pad 431c may be disposed below the third light emitting region C3', and the first electrode pad 431d may be disposed below the fourth light emitting region C4'. The second electrode pad 432 may be disposed across vertices of the light emitting regions C1', C2', C3', and C4'.

Figure 14A:
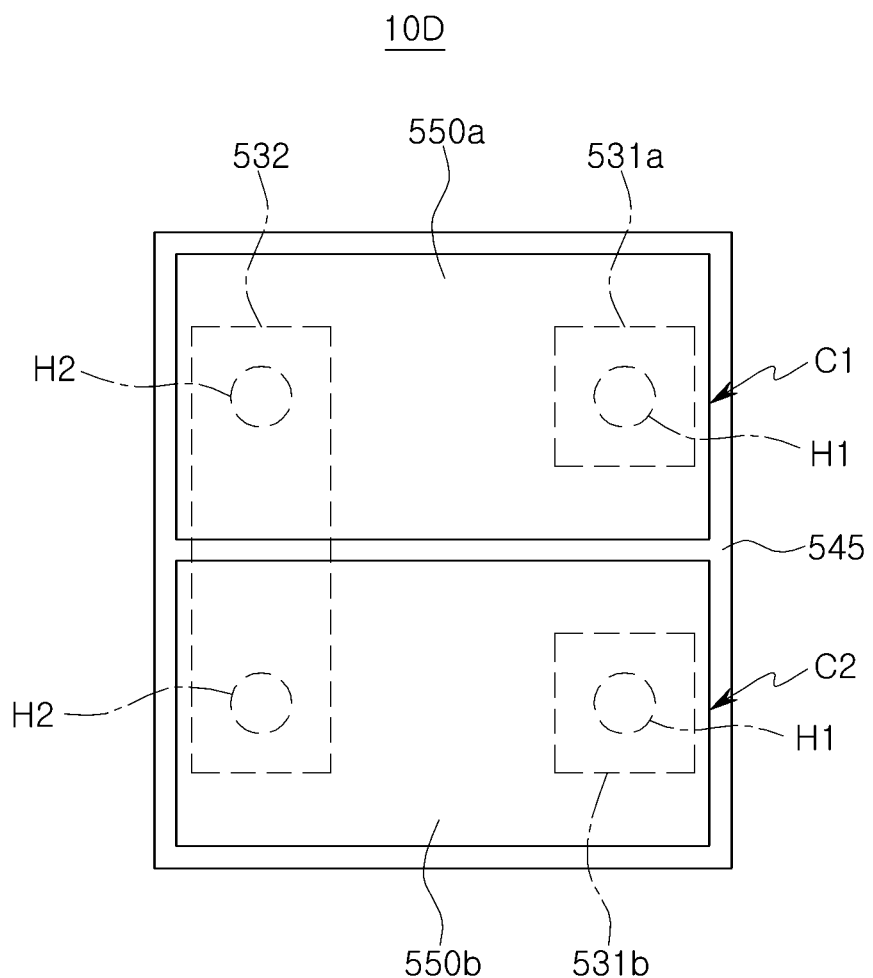
FIGS. 14A and 14B are a plan view and a rear view schematically illustrating a light emitting device package according to an example embodiment.
Figure 14B:
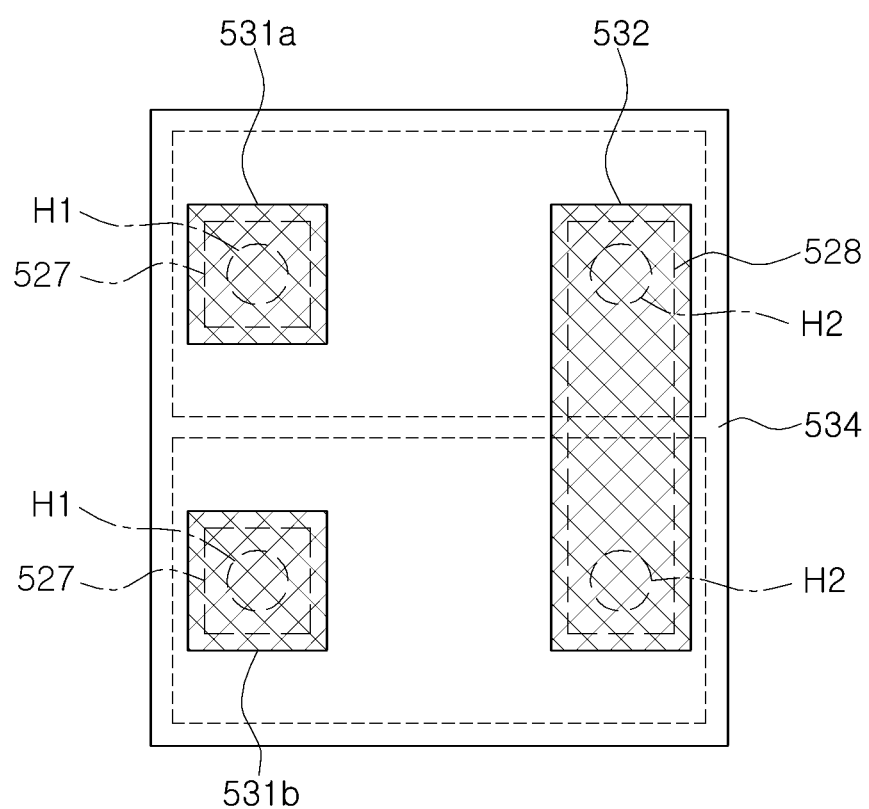

FIGS. 14A and 14B are a plan view and a rear view schematically illustrating a light emitting device package 10D according to an example embodiment. The light emitting device package 10D illustrated in FIGS. 14A and 14B is different from the light emitting device package 10 described above with reference to FIGS. 1A through 2B only in the number of plurality of light emitting regions, and thus the light emitting device package illustrated in FIGS. 14A and 14B will be described briefly.

Referring to FIGS. 14A and 14B, the light emitting device package 10D according to an example embodiment may include a light emitting structure divided into two light emitting regions C1 and C2.

The light emitting device package 10D may include first connection electrodes 527 disposed in each of the light emitting regions, first electrode pads 531a and 531b disposed on the first connection electrodes 527, respectively, a second connection electrode 528 disposed to across the two light emitting regions C1 and C2, a second electrode pad 532 disposed on the second connection electrode 528, an encapsulant part 534, light adjusting layers 550a and 550b, and a partition 545. Each of light adjusting layers 550a and 550b may include a wavelength conversion layer and a filter layer. The second electrode pad 532 may be disposed to be longer than the first electrode pads 531a and 531b. The first connection electrodes 527 may be connected through first through holes H1 to first conductivity-type semiconductor layers, respectively. The second connection electrode 528 may be connected through second through holes H2 to second conductivity-type semiconductor layers.

Figure 15A:
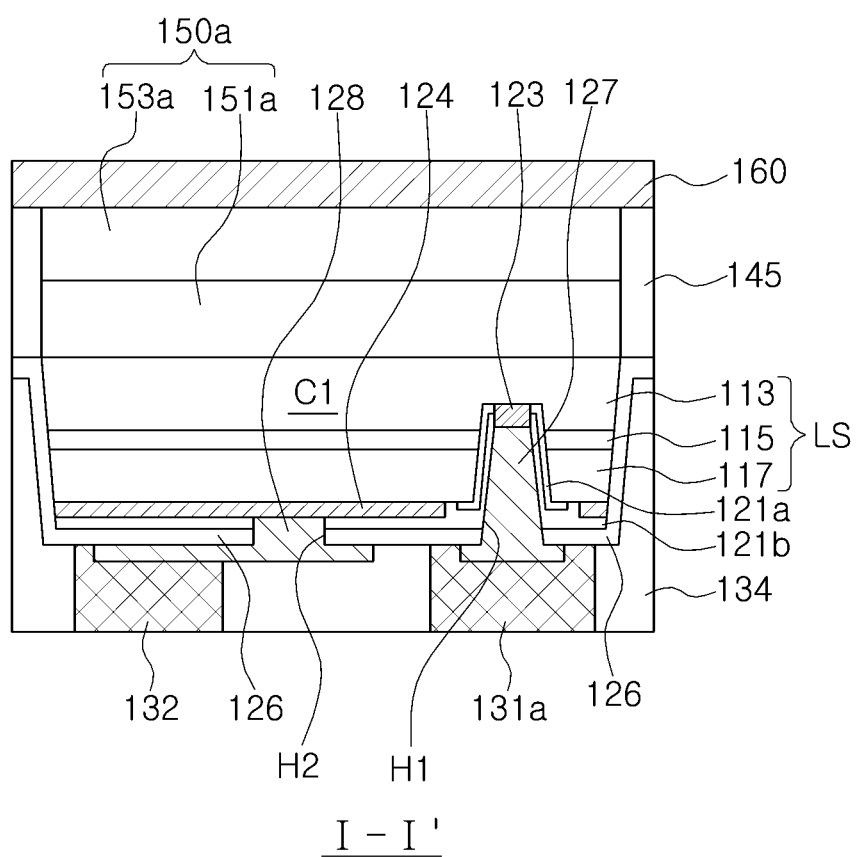
FIGS. 15A and 15B are cross-sectional views of the light emitting device package according to an example embodiment.
Figure 15B:
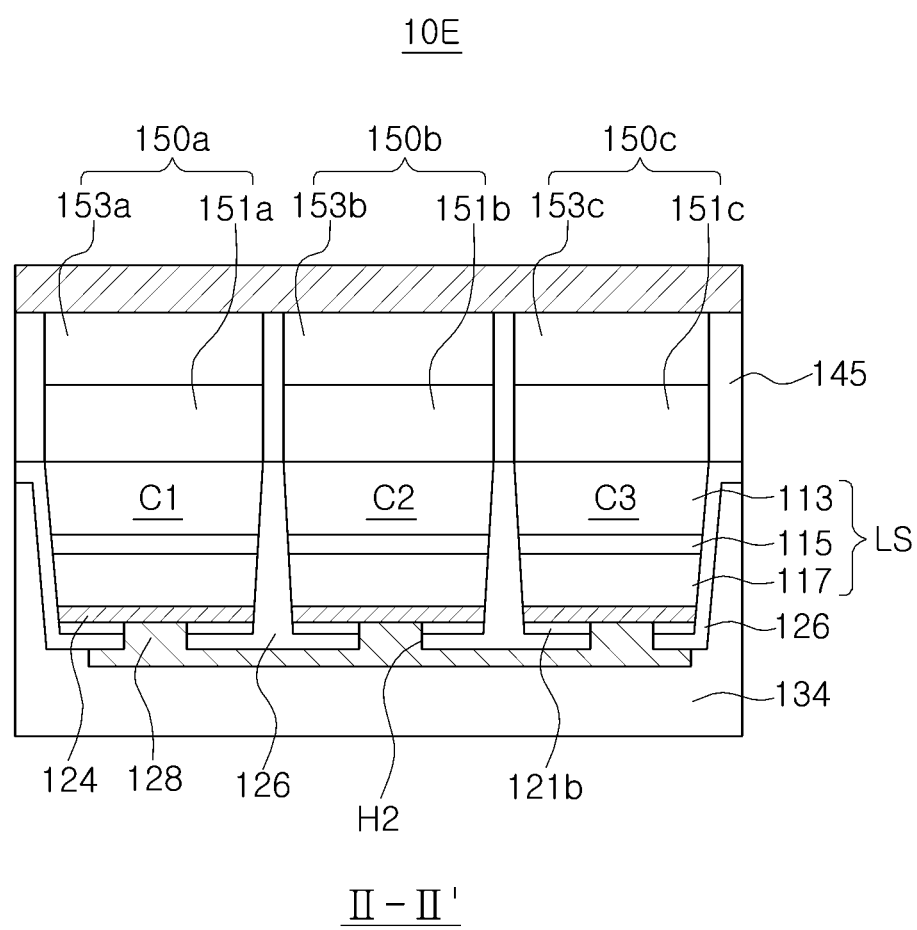

FIGS. 15A and 15B are cross-sectional views schematically illustrating a light emitting device package 10E according to an example embodiment.

Referring to FIGS. 15A and 15B, a light emitting device package 10E may have a structure further including a glass layer 160 disposed on the light adjusting layers 150a, 150b, and 150c of the light emitting device package 10 of FIGS. 1A through 2B. The glass layer 160 may prevent the light adjusting layers 150a, 150b, and 150c from being degraded by atmospheric moisture or a gas. A concave and convex structure for improvement of light extraction efficiency may be formed on an upper surface of the glass layer 160.

Figure 16A:
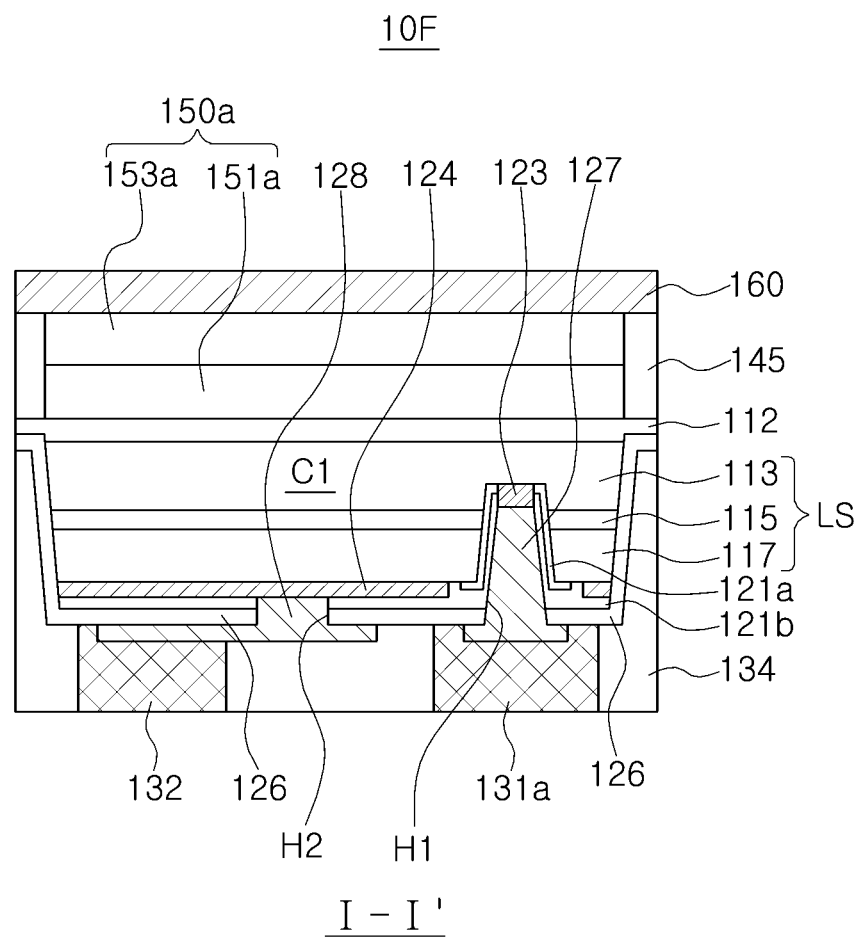
FIGS. 16A and 16B are cross-sectional views of the light emitting device package according to an example embodiment.
Figure 16B:
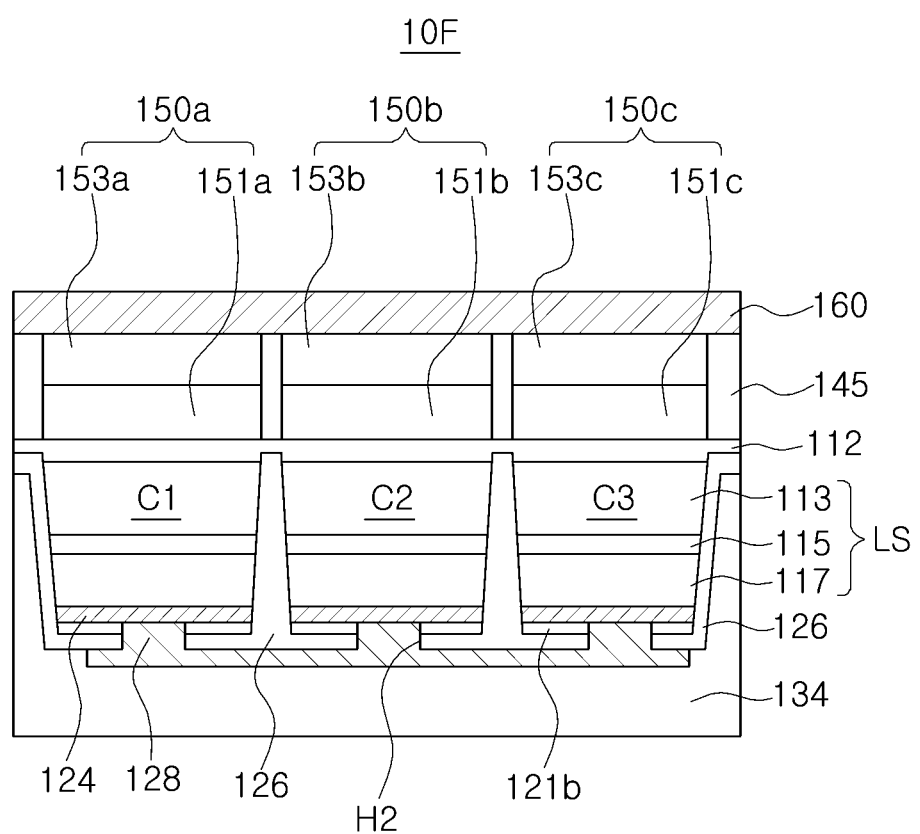

FIGS. 16A and 16B are cross-sectional views schematically illustrating a light emitting device package 10F according to an example embodiment.

Referring to FIGS. 16A and 16B, a light emitting device package 10F may further include a glass layer 160 and a buffer layer 112, in comparison with the light emitting device package 10 of FIGS. 1A through 2B. The glass layer 160 is disposed above light adjusting layers 150a, 150b, and 150c to prevent the light adjusting layers 150a, 150b, and 150c from being degraded by atmospheric moisture or a gas. A concave and convex structure for the improvement of light extraction efficiency may be formed on an upper surface of the glass layer 160. The buffer layer 112 may be disposed between each of the wavelength conversion layers 151a, 151b, and 151c and each of first conductivity-type semiconductor layers 113. In addition, the buffer layer 112 may be disposed between a partition 145 and an isolation insulating layer 126. The isolation insulating layer 126 may have a form in which a portion of the isolation insulating layer 126 is inserted into the buffer layer 112. The buffer layer 112 may be formed on a growth substrate to reduce a defect of a light emitting structure LS, and may remain after the growth substrate is removed. The buffer layer 112 may include a high resistance material which prevents the light emitting regions C1, C2, and C3 from being electrically connected to one another. The buffer layer 112 may be formed of $In_xAl_yGa_{1-x-y}N$, where $0 \leq x \leq 1$, and $0 \leq y \leq 1$. For example, the buffer layer may be formed of AlN, AlGaN, or InGaN. The buffer layer 112 may be formed of a plurality of layers having different compositions, or may be formed of a single layer in which compositions are gradually changed.

Figure 17A:
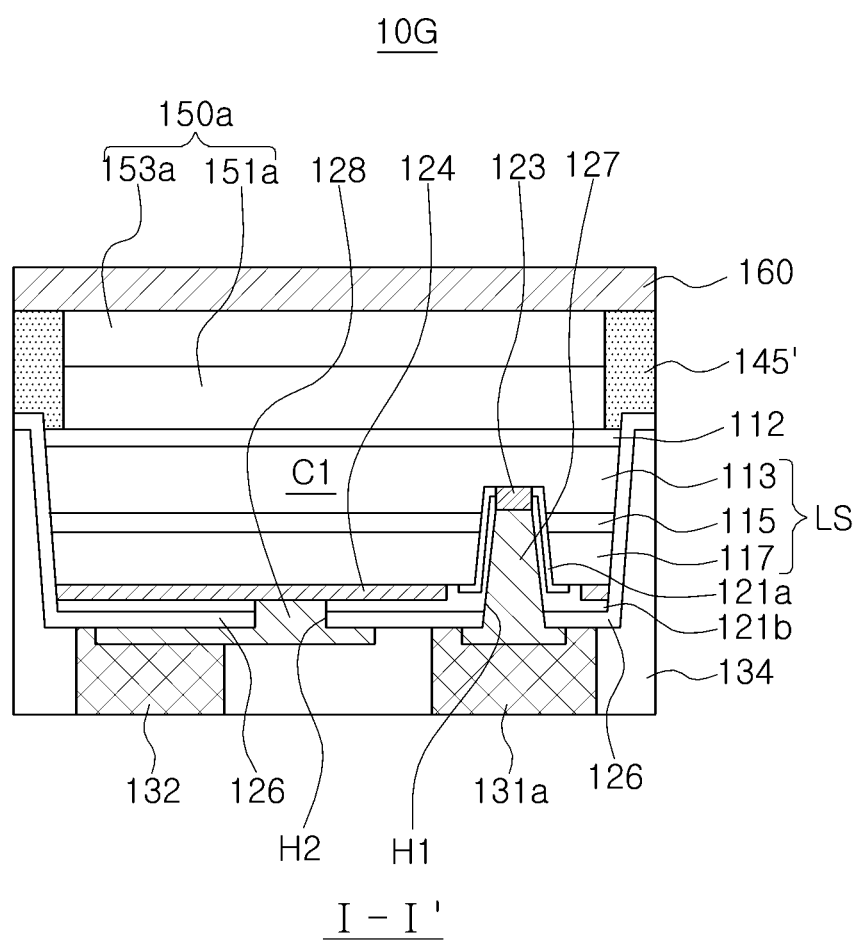
FIGS. 17A and 17B are cross-sectional views of the light emitting device package according to an example embodiment.
Figure 17B:
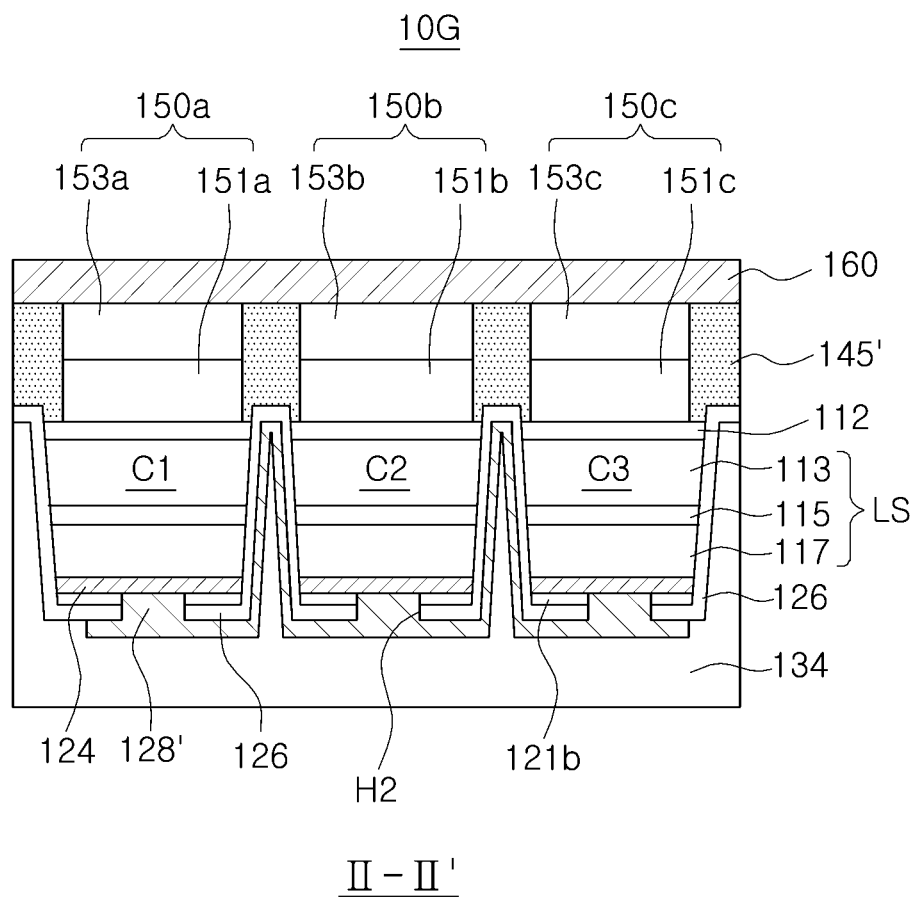

FIGS. 17A and 17B are cross-sectional views schematically illustrating a light emitting device package according to an example embodiment.

Referring to FIGS. 17A and 17B, a light emitting device package 10G may further include a glass layer 160 on light adjusting layers 150a, 150b, and 150c in a manner different from the light emitting device package 10 of FIGS. 1A through 2B, and may further include a buffer layer 112 between respective wavelength conversion layers 151a, 151b, and 151c and each of first conductivity-type semiconductor layers 113. The light emitting device package 10G may have a partition 145' having a width greater than a width of an upper portion of an isolation insulating layer 126. The partition 145' may be formed by patterning a silicon substrate used as a growth substrate. The isolation insulating layer 126 may have a form in which a portion of the isolation insulating layer 126 is inserted into the partition 145'. A portion of a second connection electrode 128' may be disposed between respective light emitting regions C1, C2, and C3, below the partition 145'.

Figure 18A:
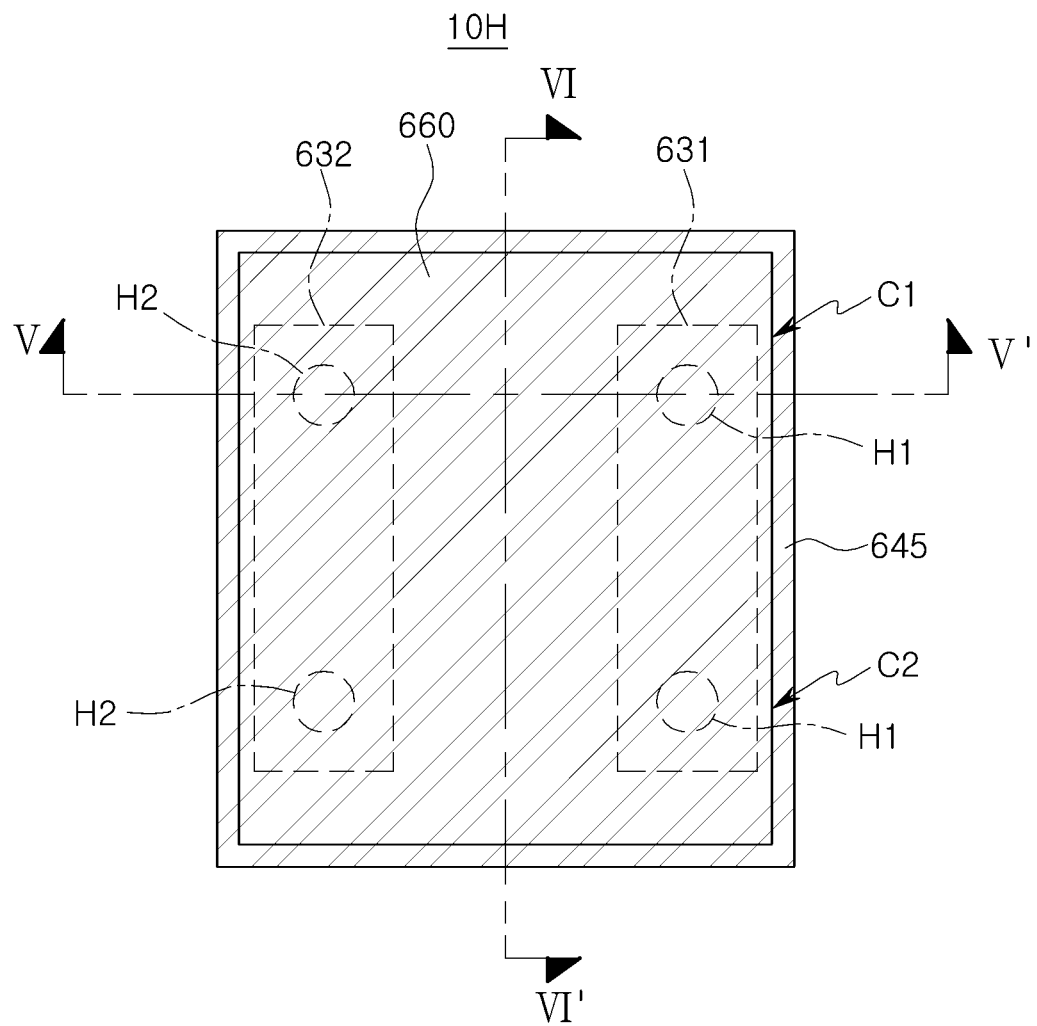
FIGS. 18A and 18B are a plan view and a rear view schematically illustrating a light emitting device package according to an example embodiment.
Figure 18B:
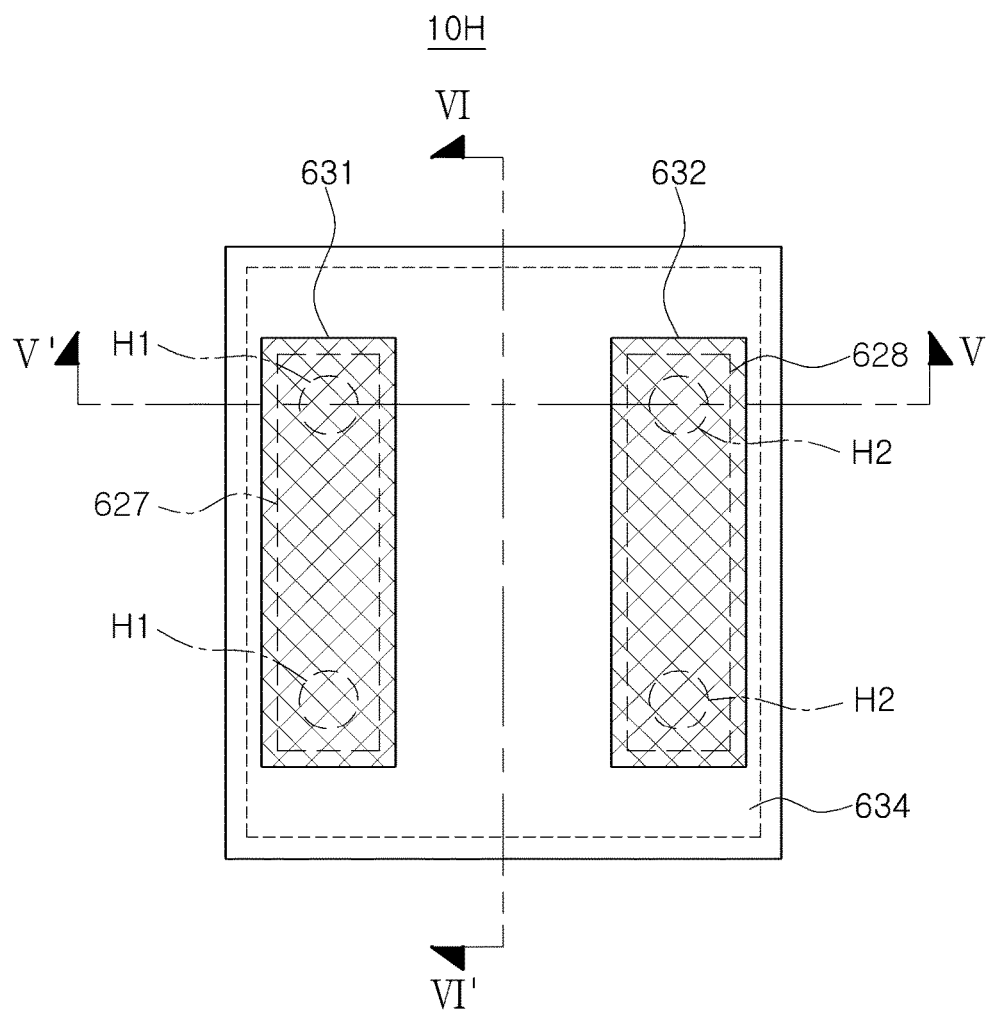
Figure 19A:
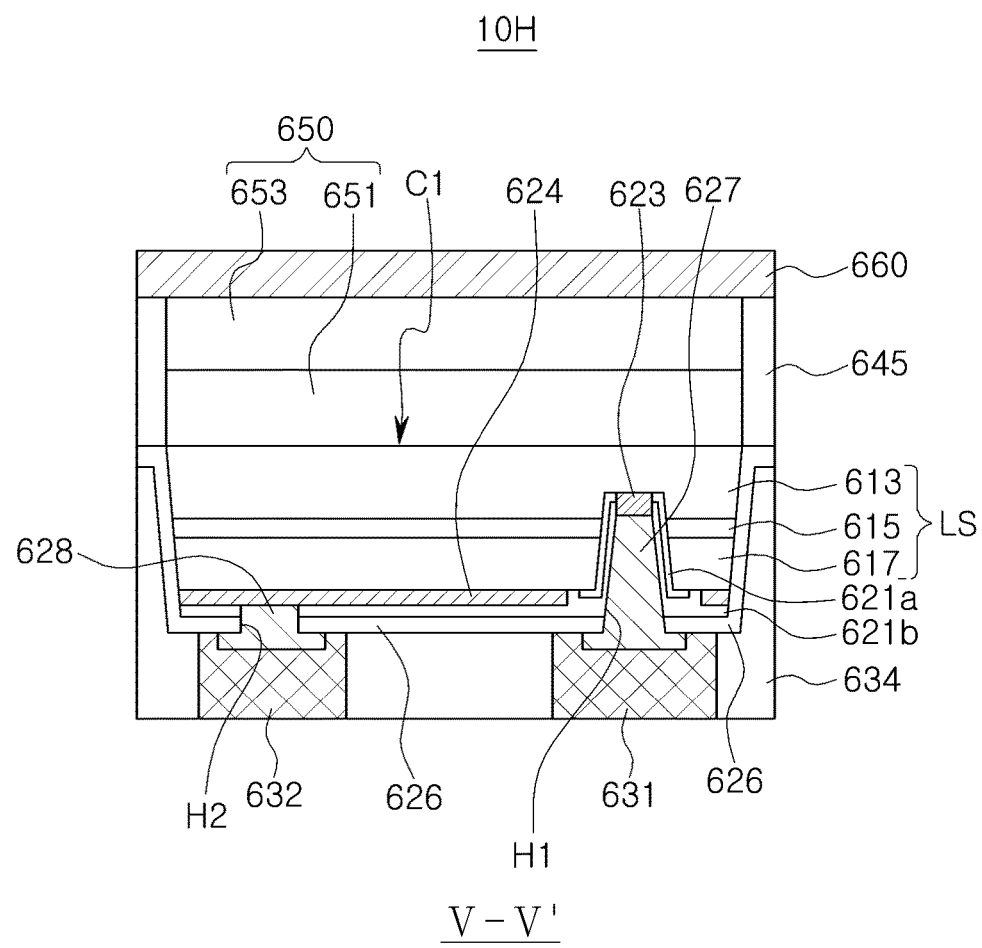
FIGS. 19A and 19B are cross-sectional views of the light emitting device package illustrated in FIG. 18A, taken along lines V-V' and VI-VI'.
Figure 19B:
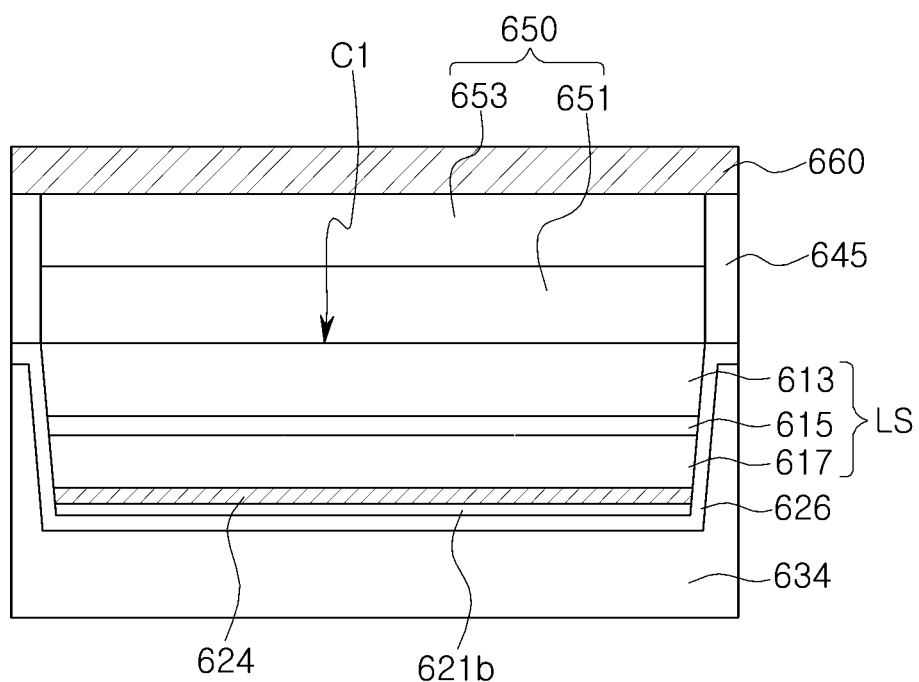

FIGS. 18A and 18B are a plan view and a rear view schematically illustrating a light emitting device package 10H according to an example embodiment. FIGS. 19A and 19B are cross-sectional views of the light emitting device package 10H illustrated in FIG. 18A, taken along lines V-V' and VI-VI'.

Referring to FIGS. 18A through 19B, a light emitting device package 10H according to an example embodiment may include a light emitting structure LS having one light emitting region C1.

The light emitting device package 10H may include first and second connection electrodes 627 and 628 disposed on the light emitting region C1, a first electrode pad 631 disposed on the first connection electrode 627, a second electrode pad 632 disposed on the second connection electrode 628, a molding layer 634, a light adjusting layer 650, a partition 645, and the like.

The light adjusting layer 650 may include a wavelength conversion layer 651 and a filter layer 653. The light emitting region C1 may emit UV light or blue light, and the wavelength conversion layer 651 may include a phosphor or a quantum dot.

The light emitting device package 10H may further include a glass layer 660 disposed on the light adjusting layer 650. A concave and convex structure for improvement of light extraction efficiency may be formed on an upper surface of the glass layer 660.

The first and second electrode pads 631 and 632 may be elongated to be adjacent to a lateral surface of the light emitting structure LS.

Figure 20A:
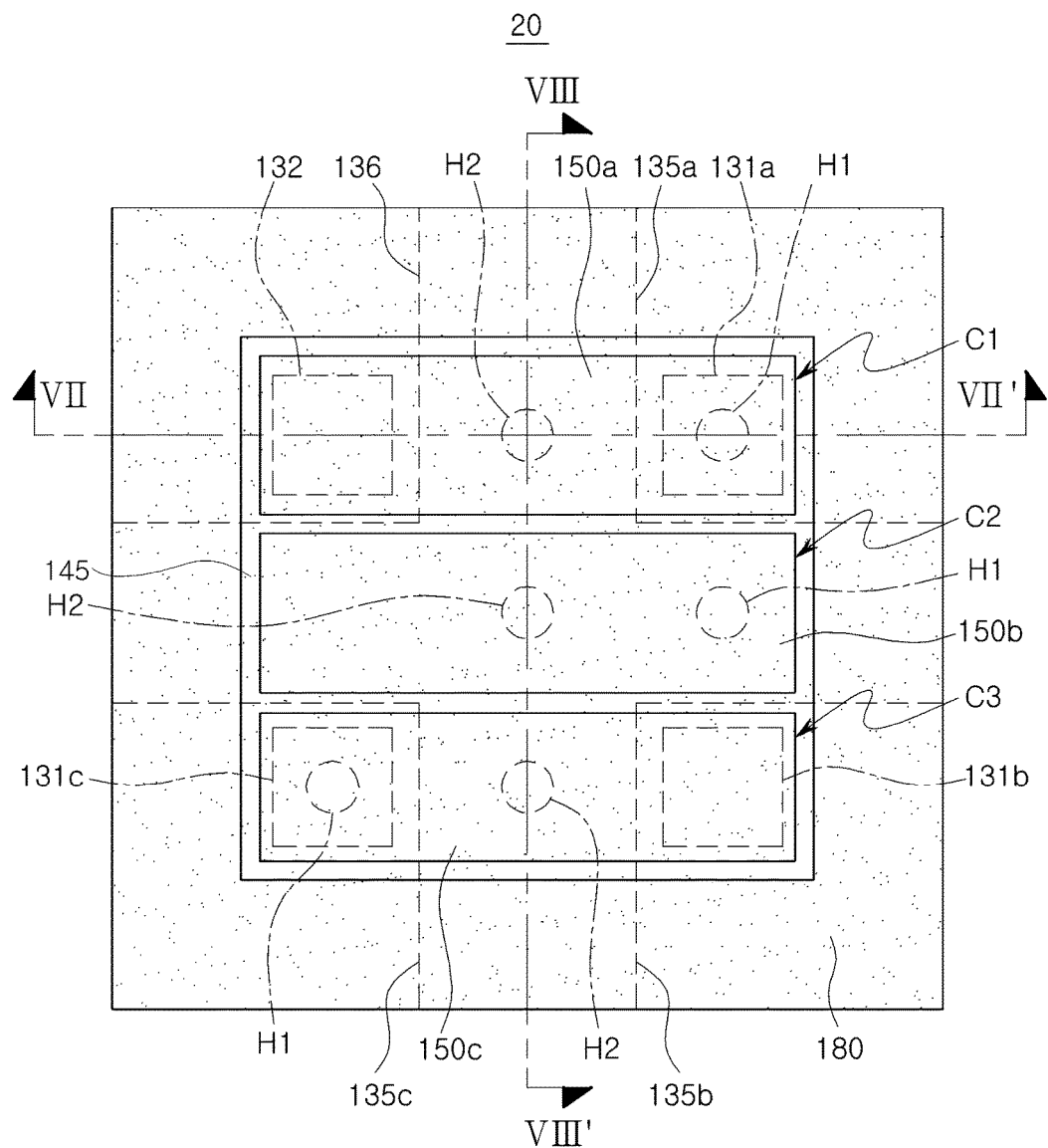
FIGS. 20A and 20B are a plan view and a rear view schematically illustrating a light emitting device package according to an example embodiment.
Figure 20B:
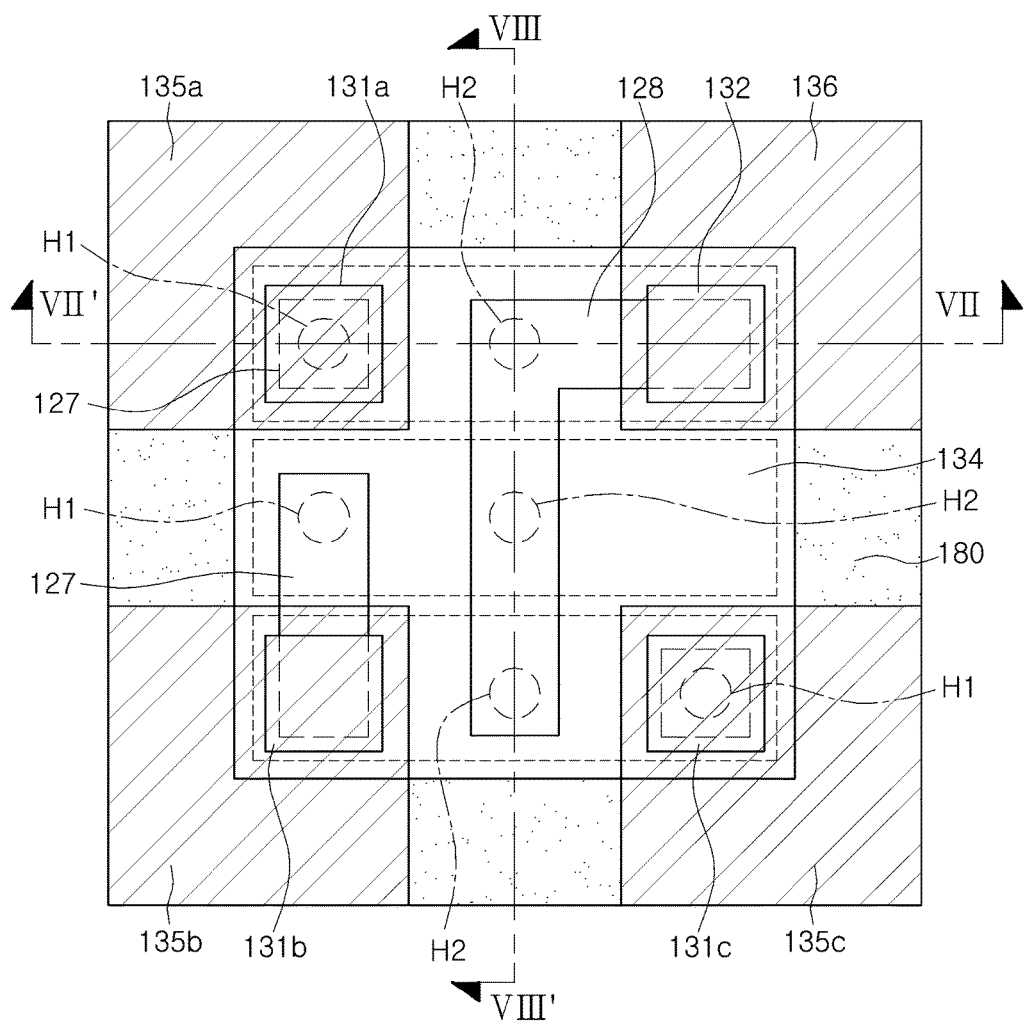
Figure 21A:
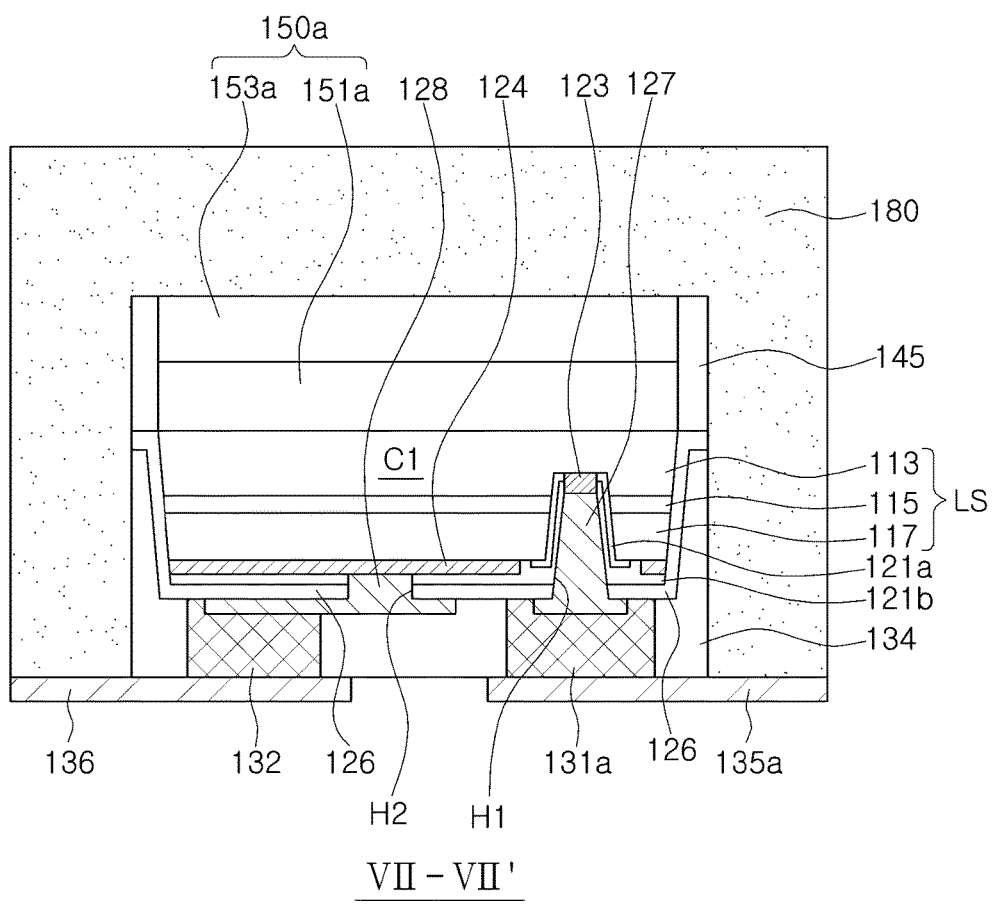
FIGS. 21A and 21B are cross-sectional views of the light emitting device package illustrated in FIG. 20A, taken along lines VII-VII' and VIII-VIII'.
Figure 21B:
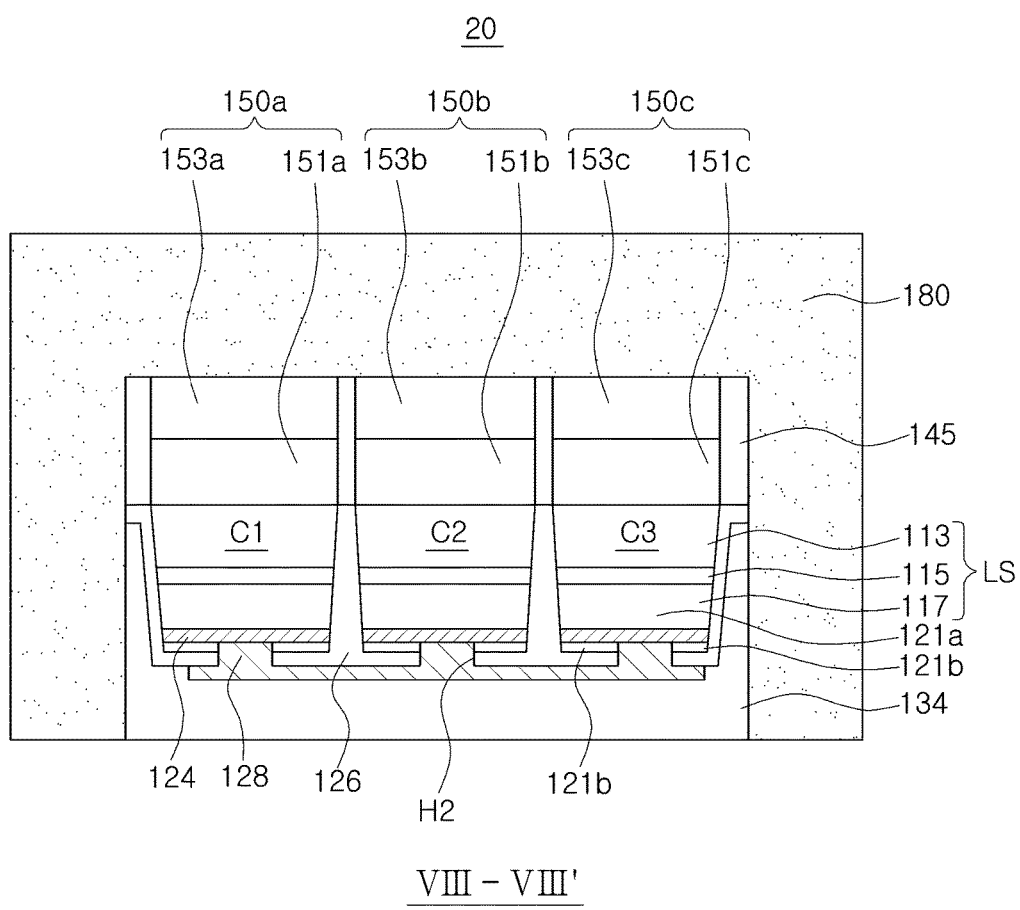

FIGS. 20A and 20B are a plan view and a rear view schematically illustrating a light emitting device package 20 according to an example embodiment. FIGS. 21A and 21B are cross-sectional views of the light emitting device package 20 illustrated in FIG. 20A taken along lines VII-VII' and VIII-VIII'.

Referring to FIGS. 20A through 21B, a light emitting device package 20 according to an example embodiment may include three light emitting regions C1, C2, and C3, first and second insulating layers 121a and 121b, an isolation insulating layer 126, first contact electrodes 123, first connection electrodes 127, three first electrode pads 131a, 131b, and 131c, second contact electrodes 124, a second connection electrode 128, a second electrode pad 132, a first encapsulant part 134, light adjusting layers 150a, 150b, and 150c, and a partition 145 in the same manner as the light emitting device package 10 in FIGS. 1A through 2B.

In addition, the light emitting device package 20 may further include a second encapsulant part 180 surrounding the light adjusting layers 150a, 150b, and 150c, the partition 145, and the first encapsulant part 134. The second encapsulant part 180 may include a light transmitting resin. For example, the second encapsulant part 180 may include an epoxy resin. Lower surfaces of first through second electrode pads 131a, 131b, 131c, and 132 and a lower surface of the first encapsulant part 134 may form a substantially flat plane. The second encapsulant part 180 may have a lower surface having a planar form corresponding to the lower surface of the first encapsulant part 134.

First bonding pads 135a, 135b, and 135c connected to the first electrode pads 131a, 131b, and 131c and a second bonding pad 136 connected to the second electrode pad 132 may be formed. The first bonding pads 135a, 135b, and 135c, and the second bonding pad 136 may be disposed to be extended from the lower surfaces of the first through second electrode pads 131a, 131b, 131c, and 132 to the lower surface of the second encapsulant part 180.

In a case where an area of the light emitting structure LS is small due to a reduction in a chip size, a region in which bonding pads are formed may be limited to be secured. In this case, the region in which bonding pads are formed may be secured using the second encapsulant part 180.

As sizes of bonding pads 135a, 135b, 135c, and 136 are secured to be a predetermined size or more, for example, a size of a side is 180 um or more, a light emitting chip may be measured using a conventional measuring device, and an SMT process of mounting a light emitting device package on a package substrate may be easily performed.

FIGS. 22A through 25B are views of each process, illustrating a method of manufacturing a light emitting device package according to an example embodiment.

Figure 22A:
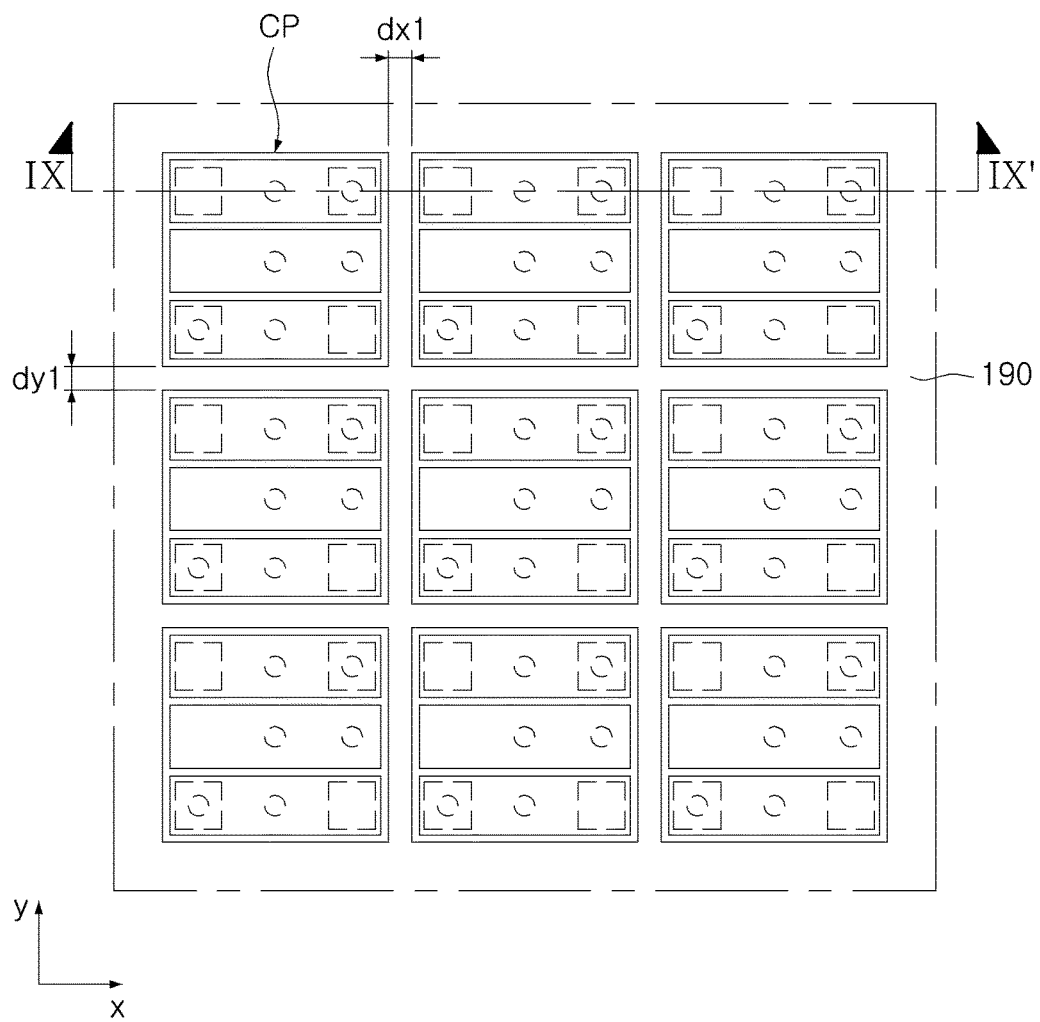
FIGS. 22A through 25B are views illustrating a process of a method of manufacturing a light emitting device package according to an example embodiment.
Figure 22B:
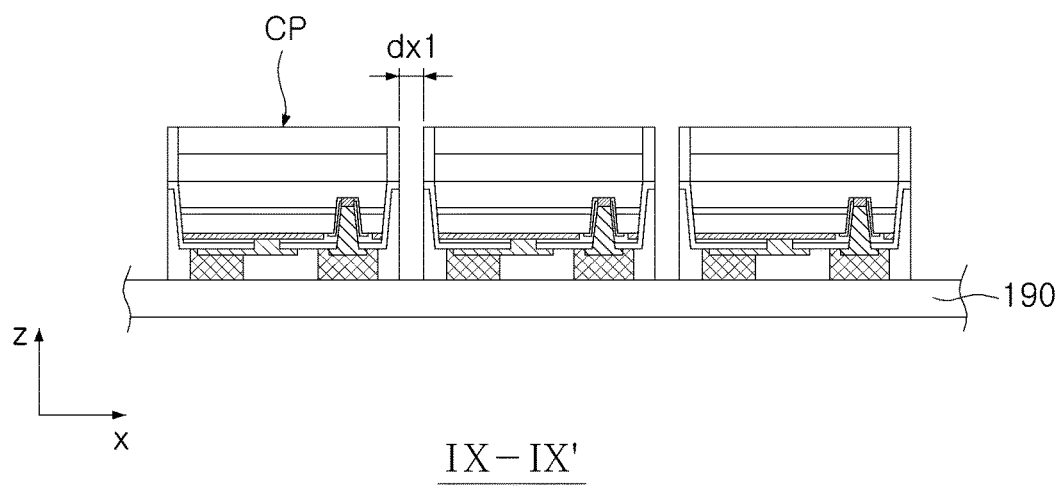

Referring to FIGS. 22A and 22B, light emitting chips CP may be attached to a film 190 which may be expanded, in a matrix form. The light emitting chips CP may be arranged to have a first distance dx1 in a first direction (x direction), and to have a second distance dy1 in a second direction (y direction). The light emitting chips CP, for example, may have a structure the same as the light emitting device package 10 in FIGS. 1A through 2B. The electrode pads 131a, 131b, 131c, and 132 of the light emitting chips CP may be attached to be in contact with the film 190.

Figure 23A:
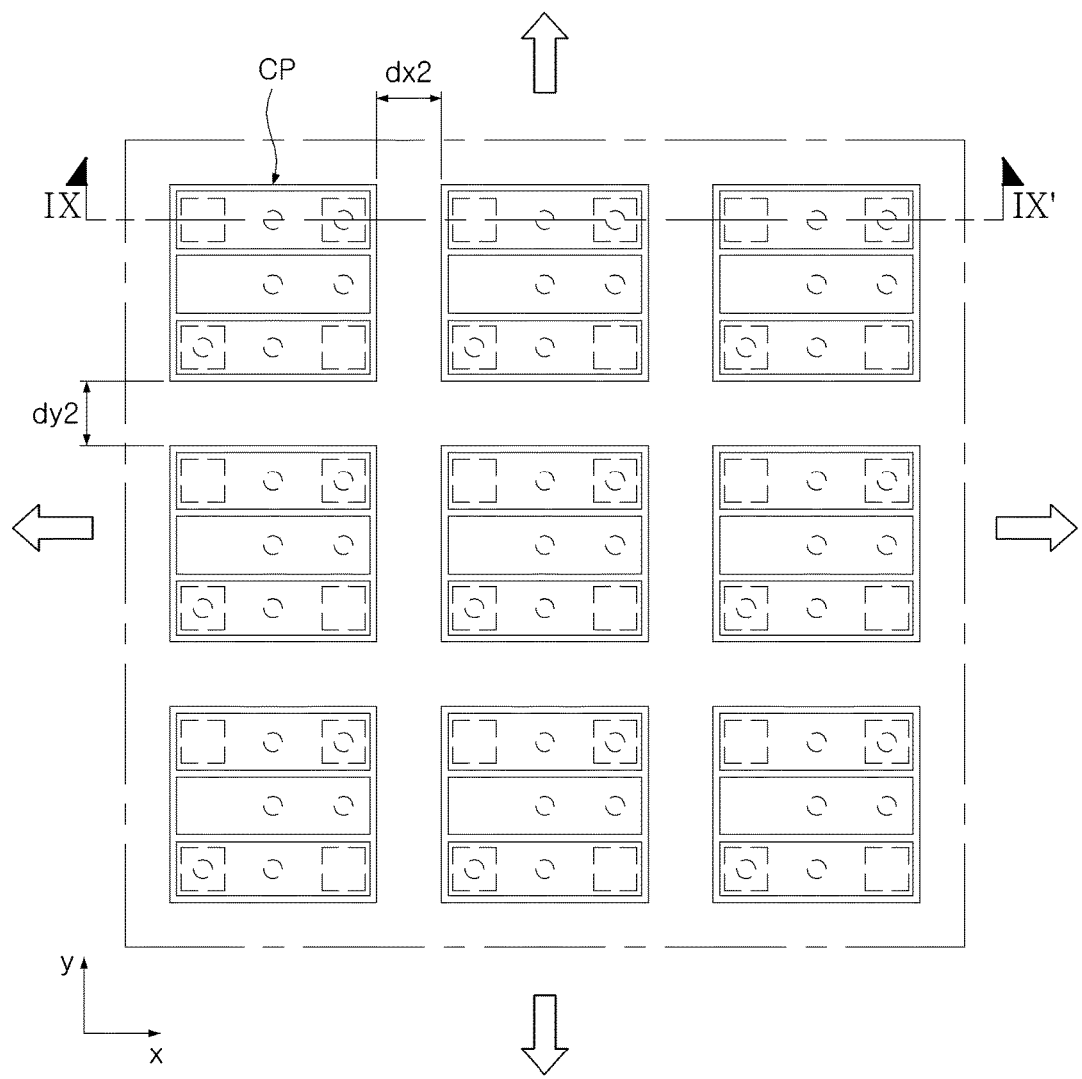
Figure 23B:
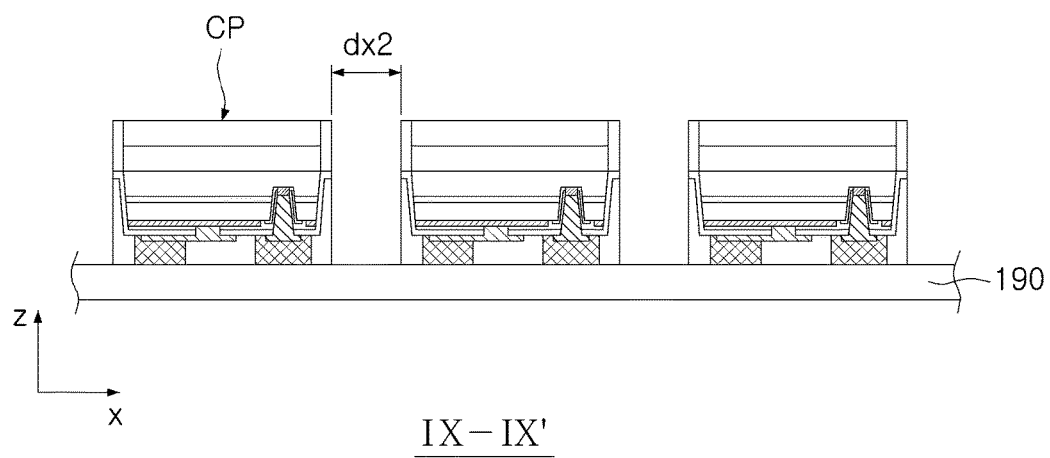

Referring to FIGS. 23A and 23B, as the film 190 is stretched in all directions, a distance of the light emitting chips CP may be widened. Thus, the light emitting chips CP may be arranged to have a third distance dx2 in a first direction (x direction), and to have a fourth distance dy2 in a second direction (y direction). The third distance dx2 is greater than the first distance dx1, and the fourth distance dy2 is greater than the second distance dy1. The third distance dx2 and the fourth distance dy2 may be determined in consideration of sizes of bonding pads to be subsequently formed.

Figure 24A:
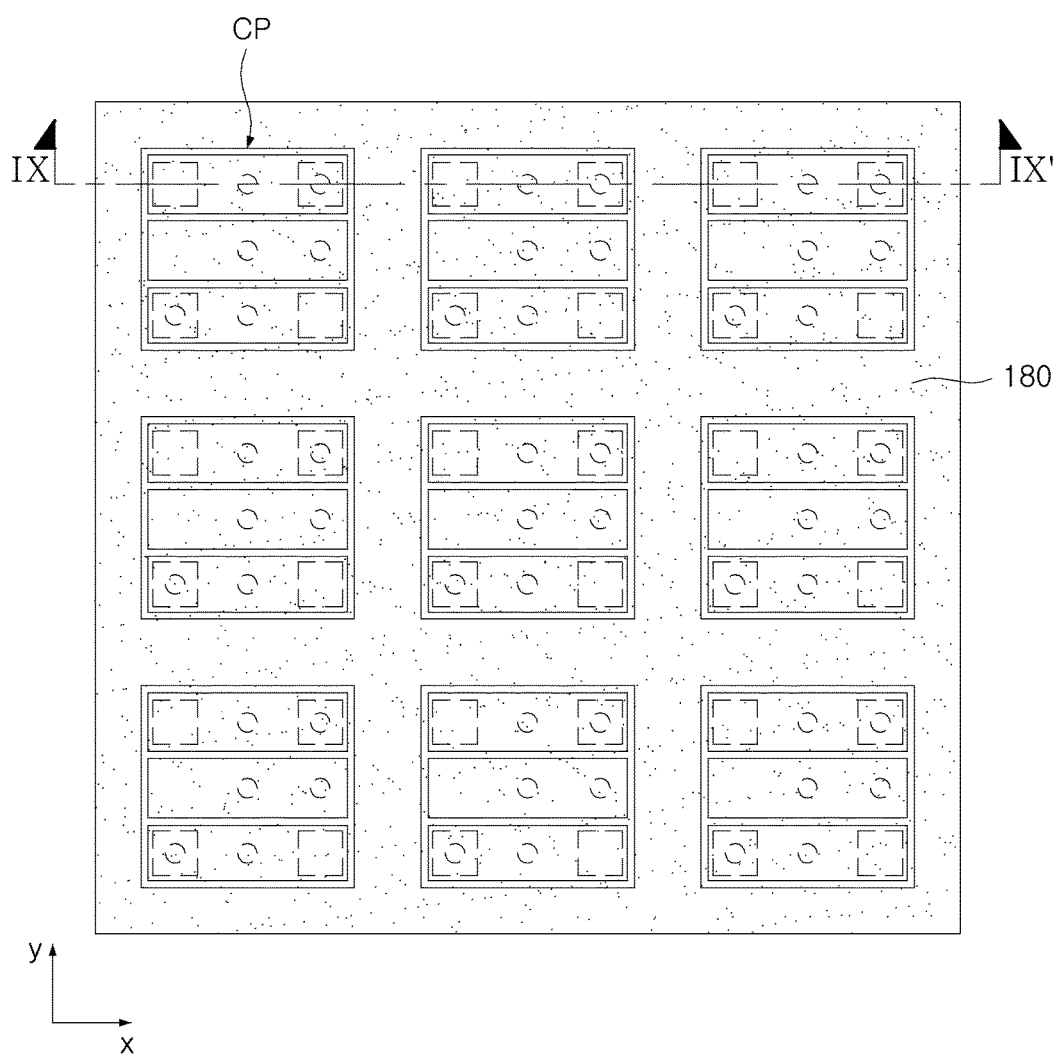
Figure 24B:
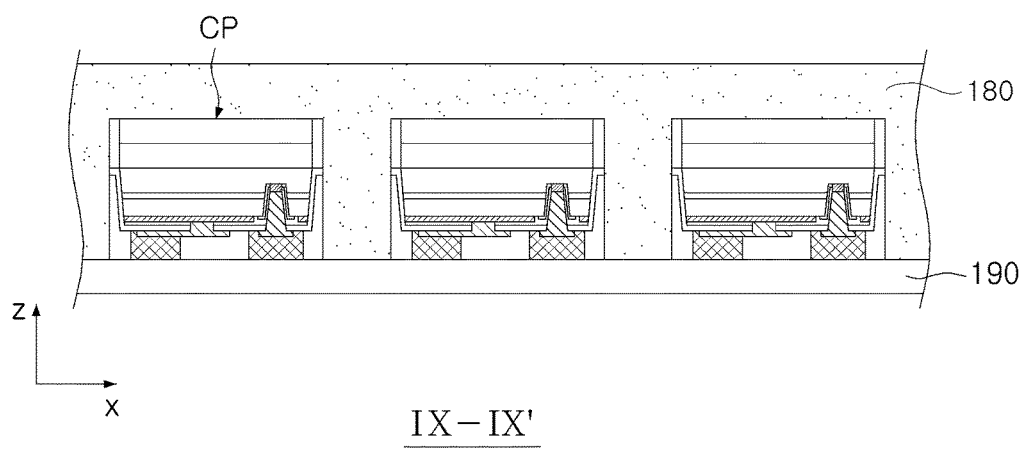

Referring to FIGS. 24A and 24B, a second encapsulant part 180 covering the light emitting chips CP may be formed. The second encapsulant part 180 may include an epoxy resin having light-transmitting properties. The second encapsulant part 180, for example, may be coated in a slit coating method, and then, may be cured. Selectively, a glass layer may be formed in an upper portion of the second encapsulant part 180.

Figure 25A:
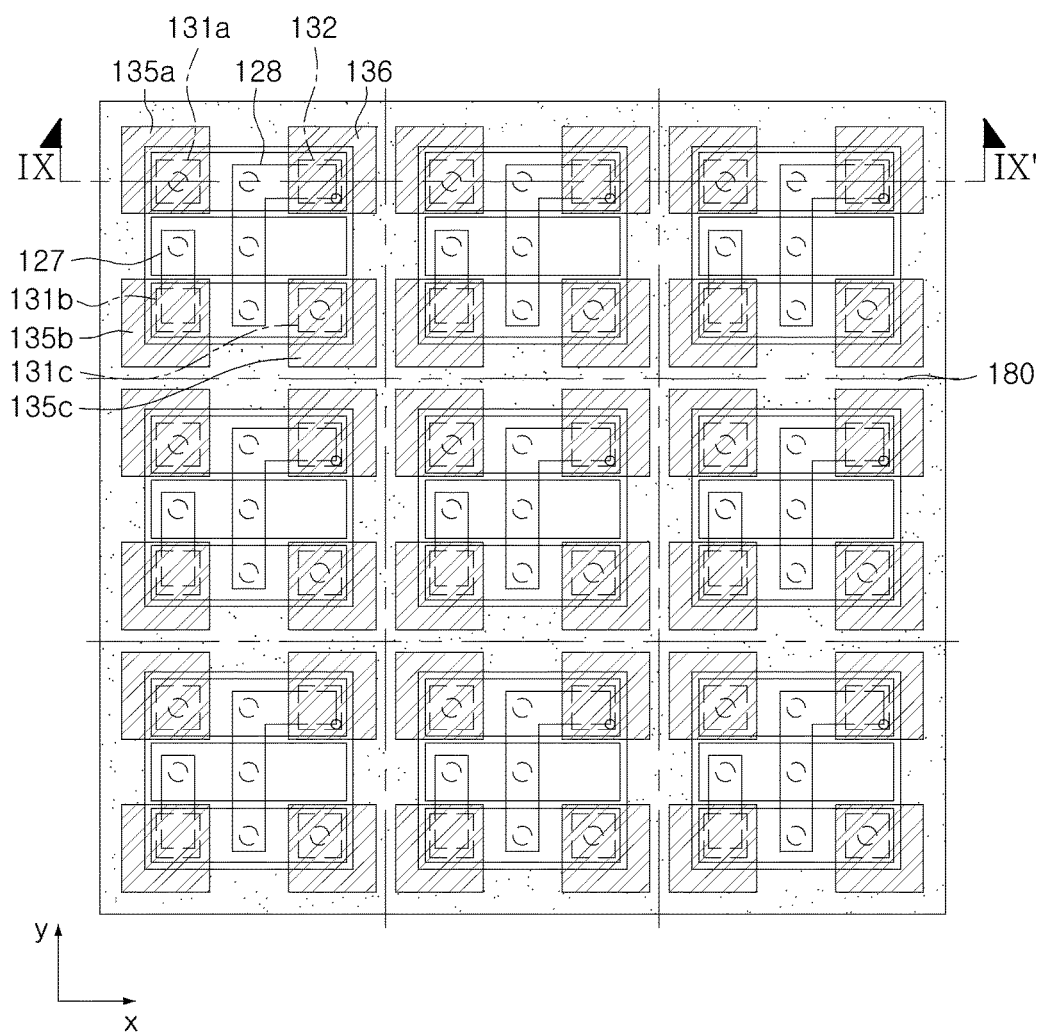
Figure 25B:
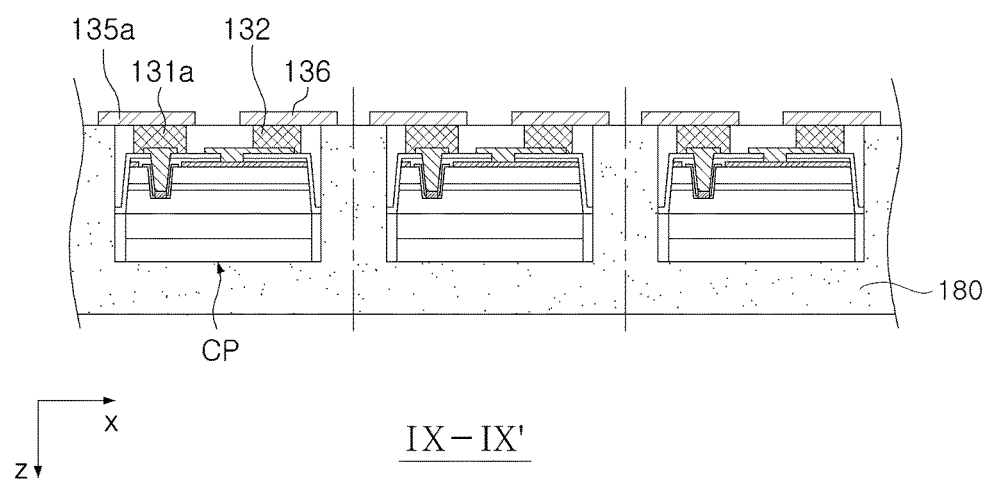

Referring to FIGS. 25A and 25B, after the film 190 is removed, remaining structures may be overturned to allow the electrode pads 131a, 131b, 131c, and 132 to face upwardly. Next, first bonding pads 135a, 135b, and 135c connected to the first electrode pads 131a, 131b, and 131c and second bonding pads 136 connected to the second electrode pad 132 may be formed. The first bonding pads 135a, 135b, and 135c, and the second bonding pads 136 may be formed to be extended to a surface of the second encapsulant part 180 to have a predetermined size or area.

Next, through cutting to form individual packages, the light emitting device package 20 of FIGS. 20A through 21B may be obtained.

Figure 26A:
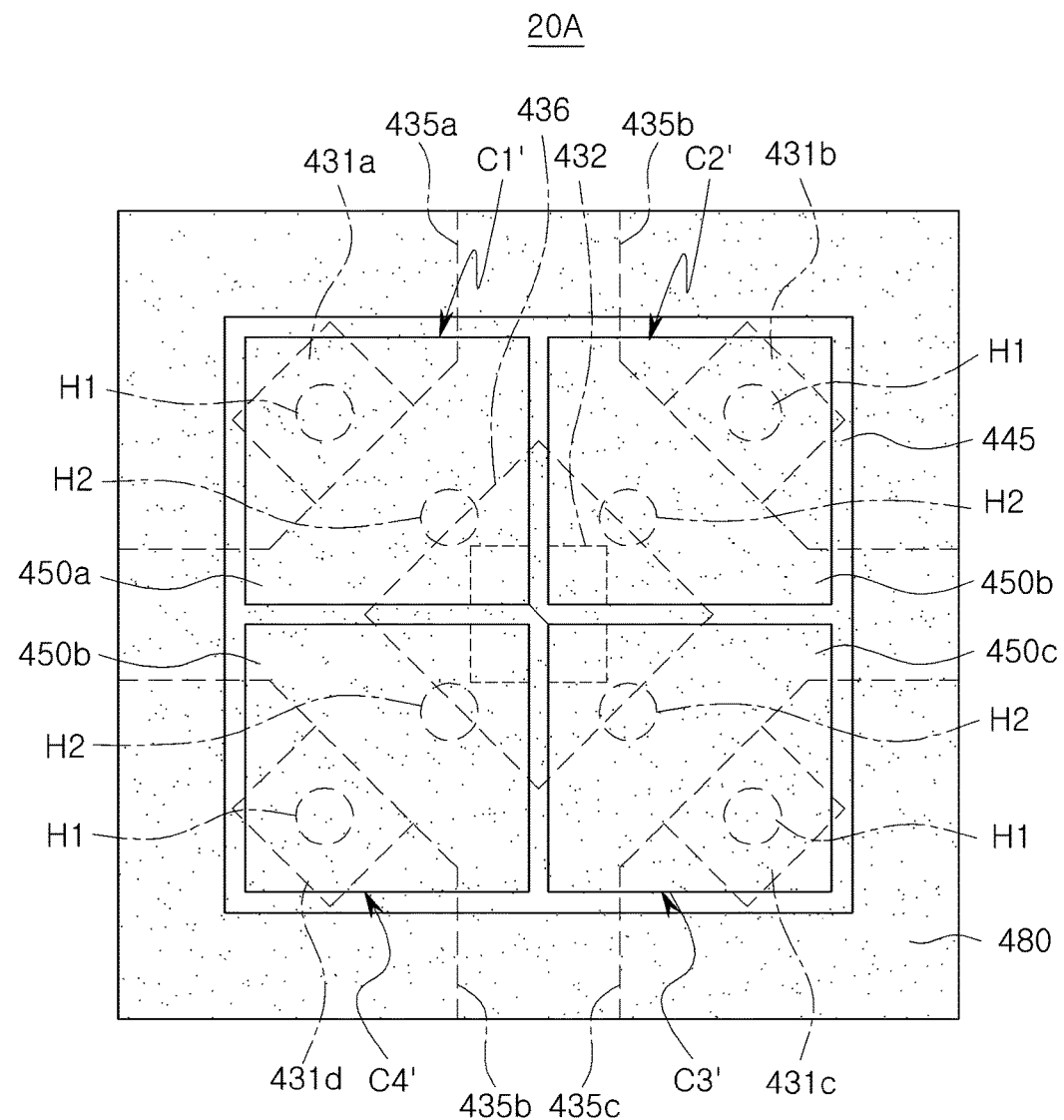
FIGS. 26A and 26B are a plan view and a rear view schematically illustrating a light emitting device package according to an example embodiment.
Figure 26B:
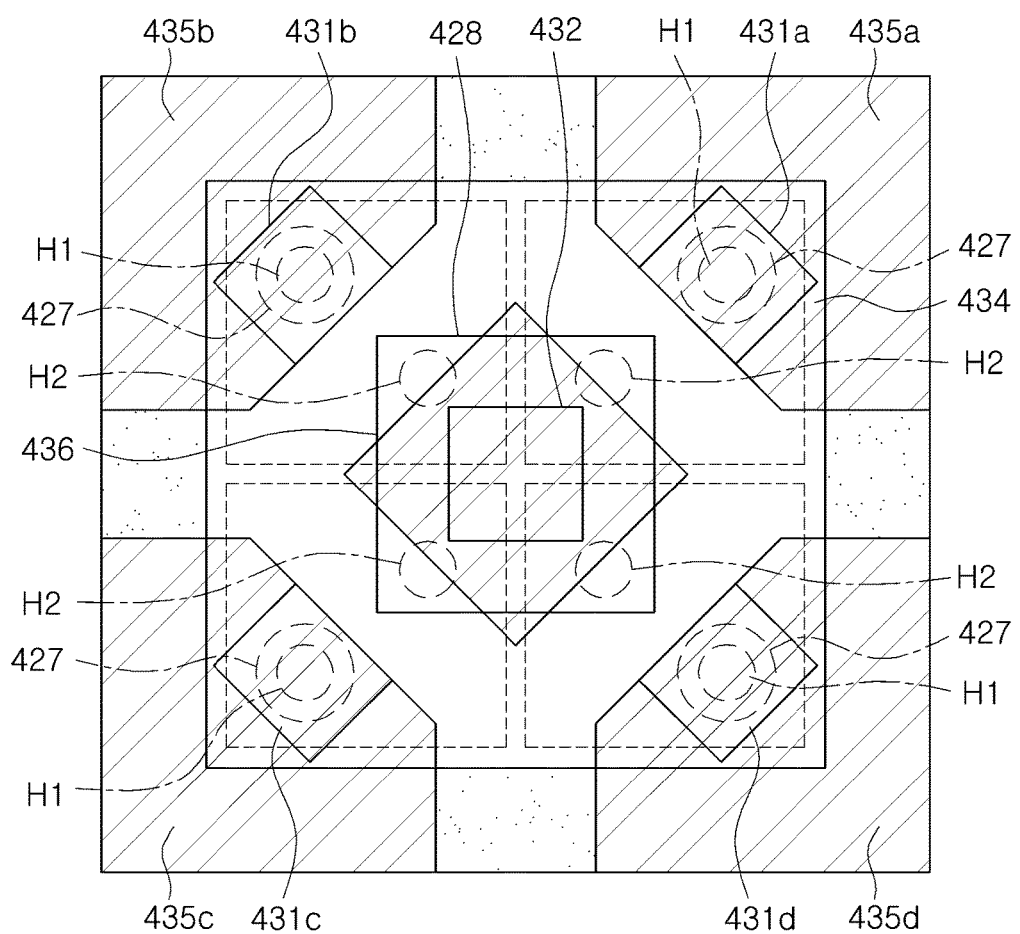

FIGS. 26A and 26B are a plan view and a rear view schematically illustrating a light emitting device package 20A according to an example embodiment.

Referring to FIGS. 26A and 26B, a light emitting device package 20A according to an example embodiment may include a light emitting structure divided in to four light emitting regions C1', C2', C3', and C4', in a manner similar to the light emitting device package 10C in FIGS. 13A through 13B. The four light emitting regions C1', C2', C3', and C4' may be arranged in 2 columns and 2 rows. The light emitting device package 20A may include first connection electrodes 427 disposed on respective light emitting regions C1', C2', C3', and C4', first electrode pads 431a, 431b, 431c, and 431d disposed on the first connection electrodes 427, a second connection electrode 428 disposed across four light emitting regions C1', C2', C3', and C4', a second electrode pad 432 disposed on the second connection electrode 428, a molding part 434, light adjusting layers 450a, 450b, 450c, and 450d, a partition 445, and the like.

In addition, the light emitting device package 20A may further include an encapsulant part 480 surrounding the light adjusting layers 450a, 450b, 450c, and 450d, the partition 445, and the molding part 434, in a manner similar to the light emitting device package 20 in FIGS. 20A through 21B. The encapsulant part 480 may include a light transmitting resin. For example, the encapsulant part 480 may include an epoxy resin.

First bonding pads 435a, 435b, 435c, and 453d connected to the first electrode pads 431a, 431b, 431c, and 431d, respectively, and a second bonding pad 436 connected to the second electrode pad 432 may be formed. The first bonding pads 435a, 435b, 435c, and 435d may be formed to be extended from lower surfaces of the first electrode pads 431a, 431b, 431c, and 431d to a lower surface of the encapsulant part 480. The second bonding pad 436 may be formed to have a size larger than the second electrode pad 142 at a predetermined interval from the first bonding pads 435a, 435b, 435c, and 435d.

In a case where an area of the light emitting structure LS is small due to a reduction in a chip size, a region in which bonding pads are formed may be limited to be secured. In this case, the region in which bonding pads are formed may be sufficiently secured using the encapsulant part 480.

Figure 27A:
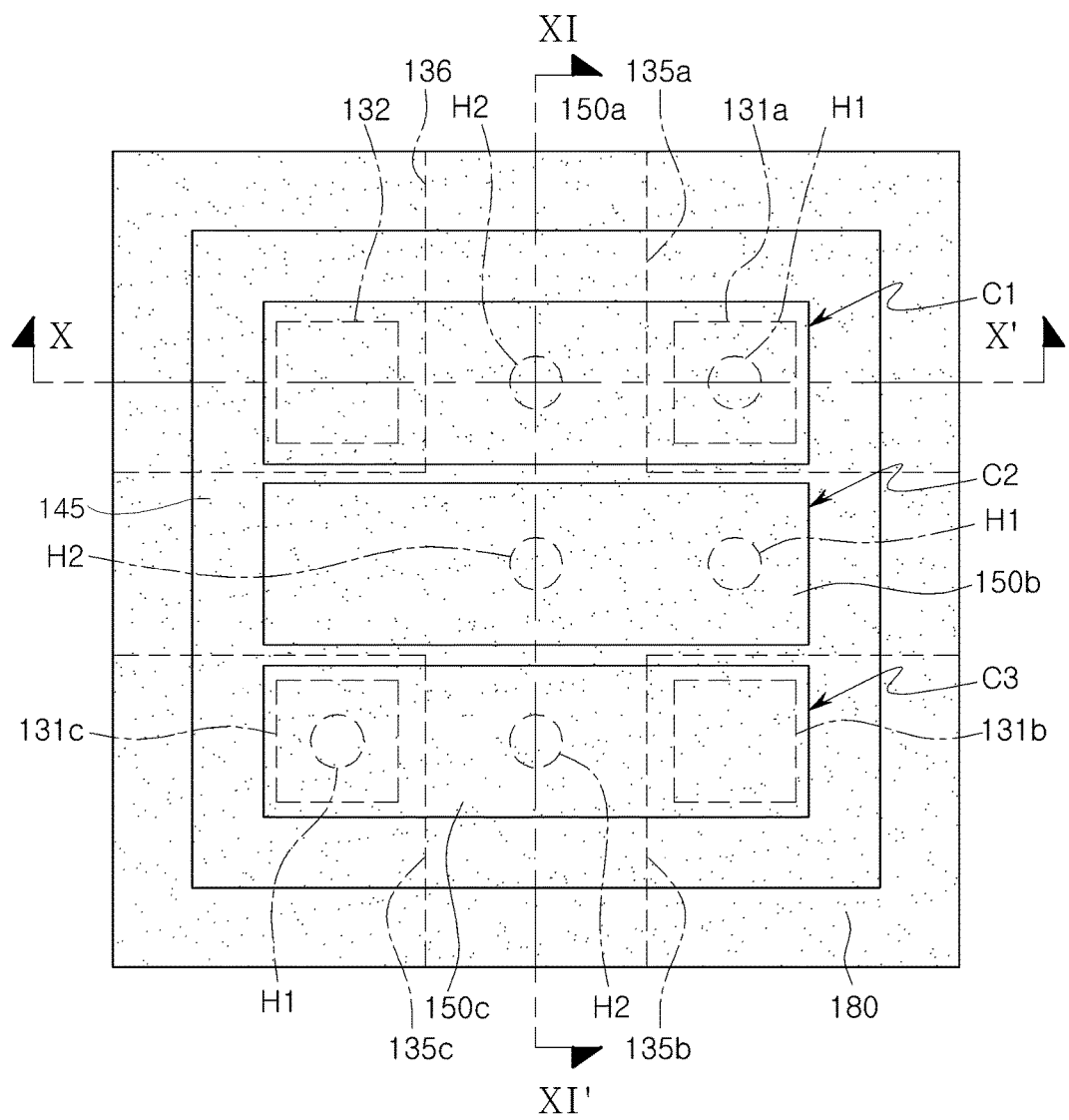
FIGS. 27A and 27B are a plan view and a rear view schematically illustrating a light emitting device package according to an example embodiment.
Figure 27B:
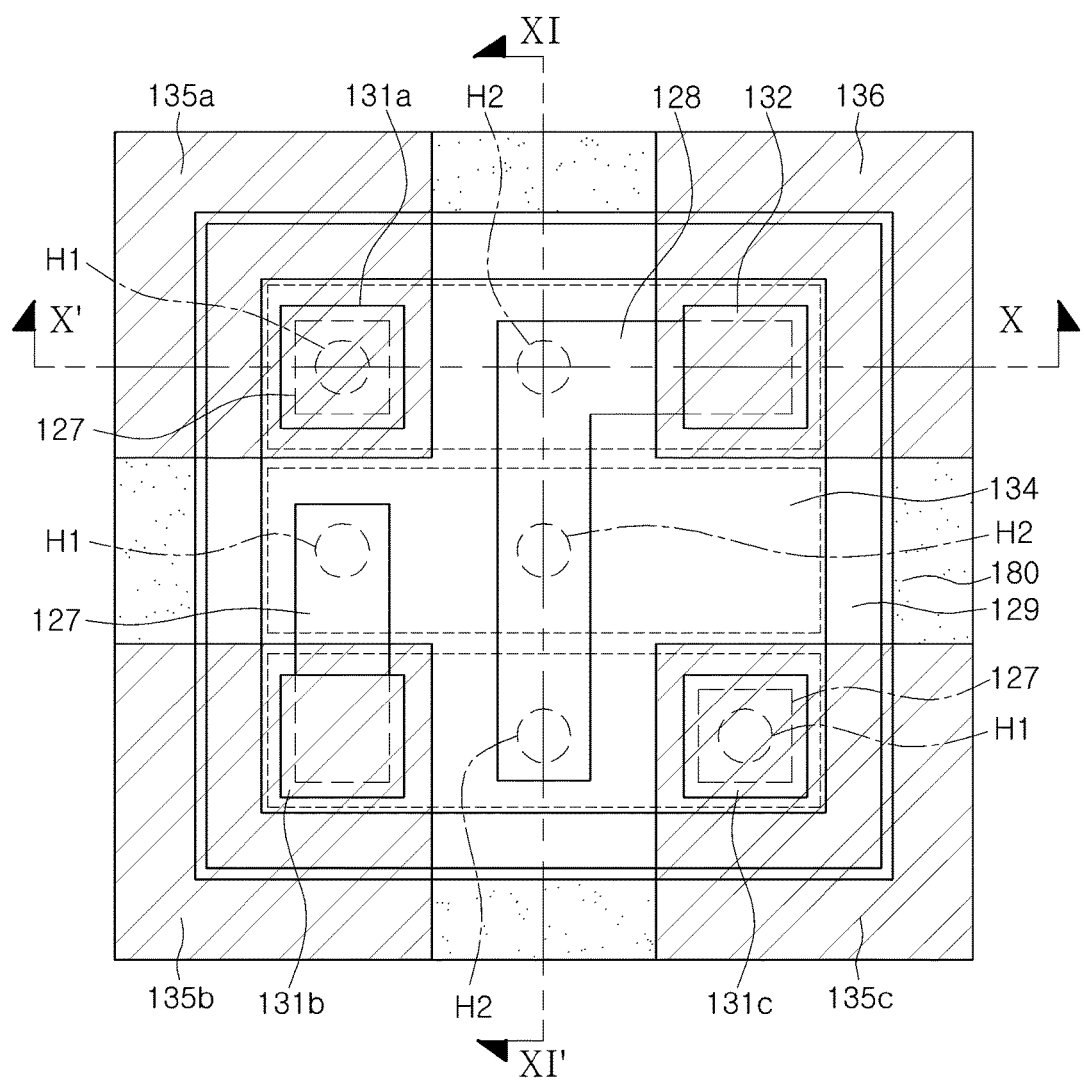
Figure 28A:
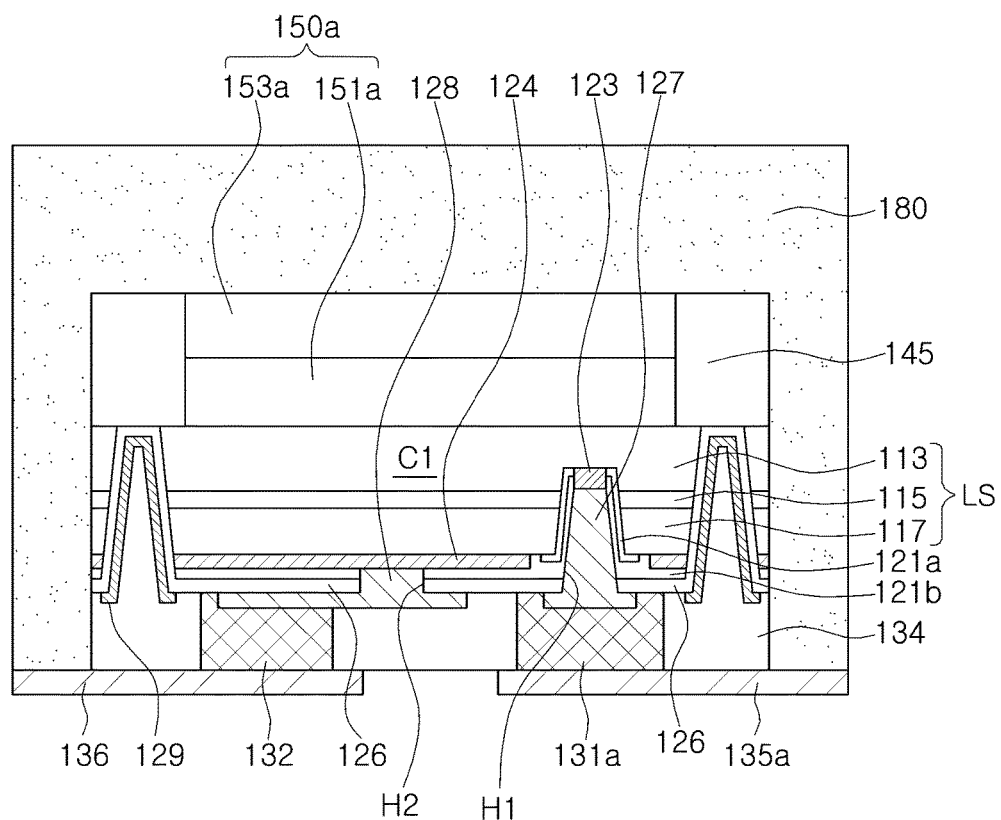
FIGS. 28A and 28B are cross-sectional views of the light emitting device package illustrated in FIG. 27A, taken along lines X-X' and XI-XI'.
Figure 28B:
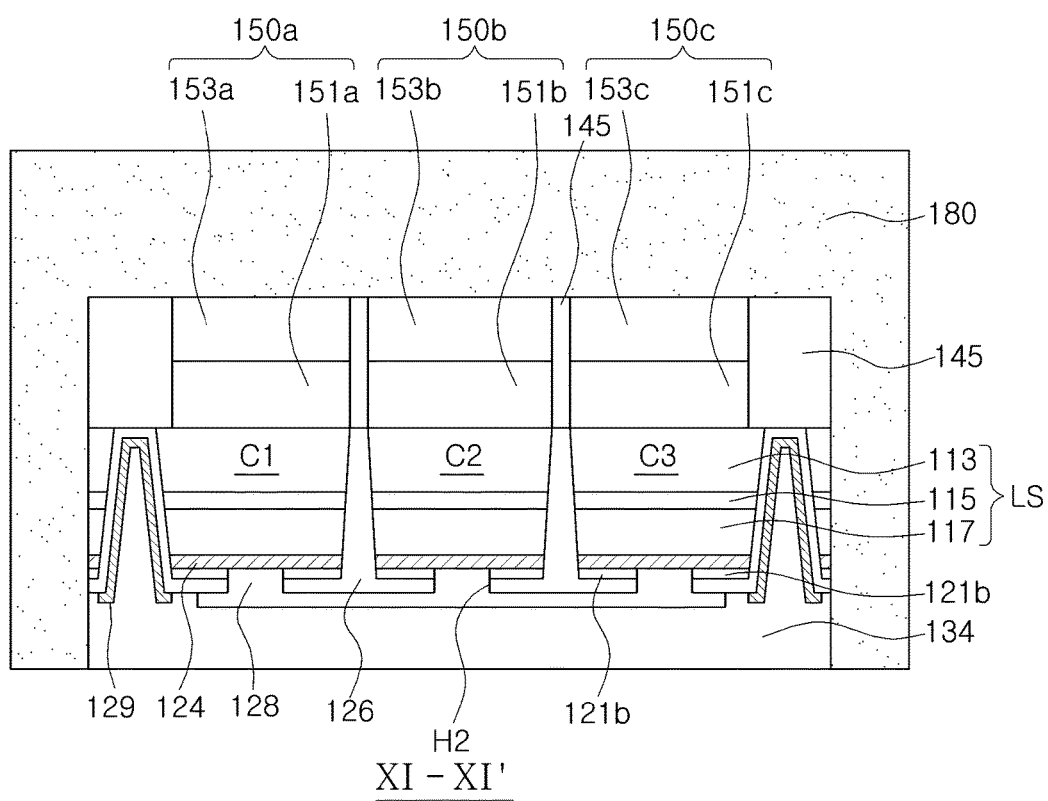

FIGS. 27A and 27B are a plan view and a rear view schematically illustrating a light emitting device package 20B according to an example embodiment. FIGS. 28A and 28B are cross-sectional views of the light emitting device package illustrated in FIG. 27A taken along lines X-X' and XI-XI'.

Referring to FIGS. 27A through 28B, a light emitting device package 20B may have a structure similar to the light emitting device package 20 in FIGS. 20A through 21B, and may further include a metal layer 129 disposed along an edge of the light emitting structure LS, in comparison with the light emitting device package 20. The metal layer 129 may be disposed below a partition 145. A width of the partition 145 located on an edge of the light emitting structure LS may be greater in comparison with the light emitting device package 20.

The metal layer 129 may prevent light emitted from the light emitting structure LS from leaking out through a lateral surface of the light emitting device package 20B.

Figure 29:
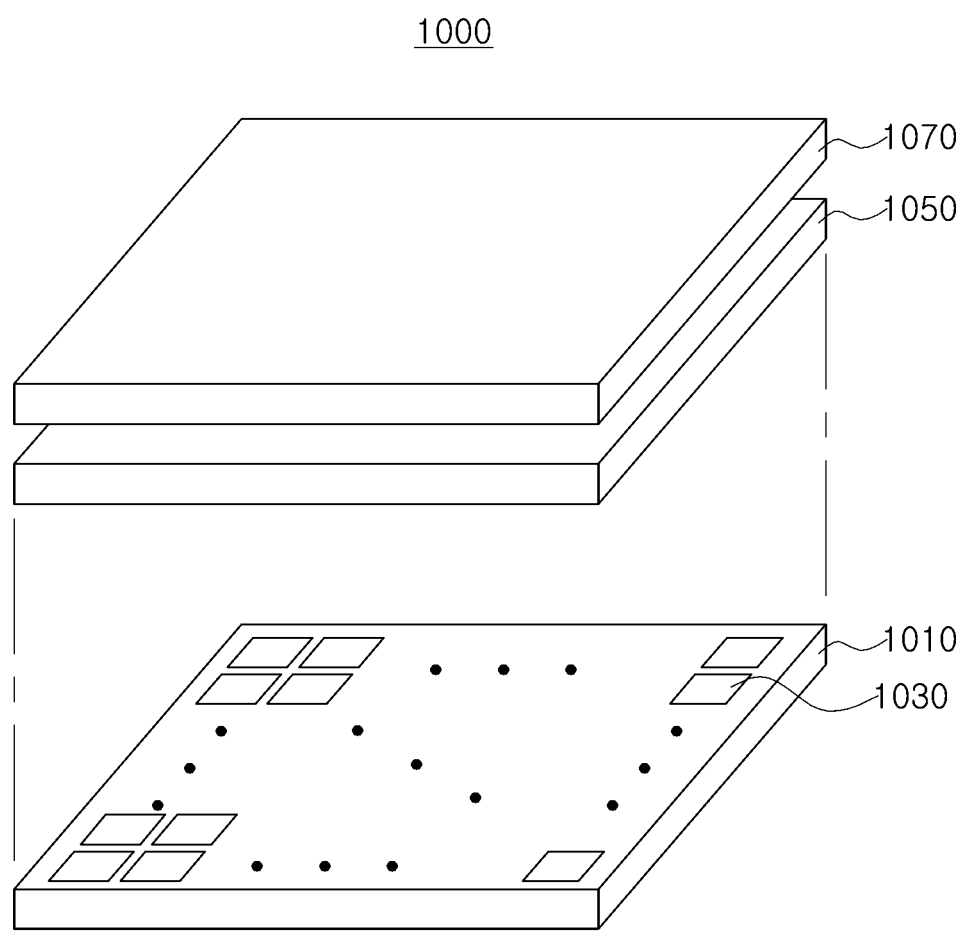
FIG. 29 is a perspective view schematically illustrating a display panel including a light emitting device package according to an example embodiment.

FIG. 29 is a perspective view schematically illustrating a display panel including a light emitting device package according to an example embodiment.

Referring to FIG. 29, a display panel 1000 may include a circuit board 1010 including a driving circuit and a control circuit, pixels 1030 disposed in a plurality of rows and a plurality of columns on the circuit board 1010, a protective layer 1050, and a polarizing layer 1070. A light emitting device package according to one of the above example embodiments may be used in the pixels 1030. In this case, a size of the pixels 1030 and pitches between the pixels 1030 may be formed to be small, expressing an image of high resolution. For example, in a case where the light emitting device package described above with reference to FIGS. 1A though 2B is employed, three light emitting regions C1, C2, and C3 may be provided as three sub-pixels.

As set forth above, according to example embodiments, a miniaturized light emitting device package capable of realizing various colors may be provided. According to example embodiments, a miniaturized light emitting device package including an expanded bonding pad may be provided.

While example embodiments have been shown and described above, it will be apparent to those skilled in the art that modifications and variations could be made without departing from the scope of the inventive concept as defined by the appended claims.

What is claimed is:

1. A light emitting device package comprising:
a light emitting structure comprising a plurality of light emitting regions configured to emit light, respectively;
a plurality of light adjusting layers formed above the light emitting regions to change characteristics of the light emitted from the light emitting regions, respectively;
a plurality of electrodes configured to control the light emitting regions to emit the light, respectively; and
an isolation insulating layer disposed between the light emitting regions to insulate the light emitting regions from one another,
wherein the light emitting regions comprises first, second and third light emitting regions,
wherein the isolation insulating layer comprises a first isolation insulating layer insulating the first light emitting region from the second light emitting region, and a second isolation insulating layer insulating the second light emitting region from the third light emitting region, and
wherein the isolation insulating layer forms a continuous structure with respect to the light emitting regions such that the first isolation insulating layer and the second isolation insulating layer are connected to each other.

2. The light emitting device package of claim 1, wherein each of the light adjusting layers comprises a wavelength conversion layer configured to convert a wavelength of the light emitted from a corresponding light emitting region among the light emitting regions.

3. The light emitting device packet of claim 2, wherein the light emitted from the light emitting regions have a same wavelength, and
wherein the wavelength conversion layers are configured to convert the wavelength of the light differently.

4. The light emitting device package of claim 2, wherein each of the light adjusting layers further comprises a filter layer disposed above the wavelength conversion layer, and configured to selectively block the light of which the wavelength is converted at the wavelength conversion layer.

5. The light emitting device package of claim 4, further comprising a glass layer disposed above the light adjusting layers.

6. The light emitting device package of claim 5, wherein the glass layer comprises a concave and convex structure disposed on an upper surface of the glass layer.

7. The light emitting device package of claim 1, wherein each of the light emitting regions comprises a first conductivity-type semiconductor layer, an active layer and a second conductivity-type semiconductor layer, and
wherein the electrodes comprise:
a plurality of first connection electrodes respectively connected to the first conductivity-type semiconductor layers of the light emitting regions; and
a second connection electrode commonly connected to the second conductivity-type semiconductor layers of the light emitting regions.

8. The light emitting device package of claim 7, wherein the electrodes further comprises:
a plurality of first electrode pads respectively connected to the first connection electrodes; and
a second electrode pad connected to the second connection electrode,
wherein a number of the first electrode pads is equal to a number of the light emitting regions, and
wherein at least two of the first electrode pads are disposed below a same light emitting region among the light emitting regions.

9. The light emitting device package of claim 8, wherein one of the plurality of first electrode pads and the second electrode pad are disposed below a same light emitting region among the light emitting regions.

10. The light emitting device package of claim 8, wherein the first connection electrode connected to the first conductivity-type semiconductor layer of one of the light emitting regions is extended below another of the light emitting region, and connected to one of the at least two first electrode pads.

11. The light emitting device package of claim 10, wherein a plan view structure of the light emitting device package takes a quadrangle form, and
wherein the first electrode pads and the second electrode pad are disposed close to vertices of the light emitting device package in the plan view, respectively.

12. The light emitting device package of claim 1, further comprising a partition disposed above the isolation insulating layer and between the light adjusting layers, and configured to prevent the light emitted through the light adjusting layers from interfering one another,
wherein the partition forms a continuous structure with respect to the light adjusting layers.

13. The light emitting device package of claim 12, wherein a portion of the isolation insulating layer is inserted into a bottom of the partition.

14. The light emitting device package of claim 12, wherein each of the light emitting regions comprises a first conductivity-type semiconductor layer, an active layer and a second conductivity-type semiconductor layer, and
wherein the electrodes comprise:
a plurality of first connection electrodes respectively connected to the first conductivity-type semiconductor layers of the light emitting regions; and
a second connection electrode commonly connected to the second conductivity-type semiconductor layers of the light emitting regions, and
wherein a portion of the second connection electrode is disposed between light emitting regions and below the partition.

15. The light emitting device package of claim 1, further comprising a buffer layer disposed between the light emitting structure and the plurality of light adjusting layers.

16. The light emitting device package of claim 15, wherein a portion of the isolation insulating layer is inserted into the buffer layer.

17. A light emitting device package comprising:
a light emitting structure comprising a plurality of light emitting regions configured to emit light, respectively;
a plurality of light adjusting layers formed above the light emitting regions to change characteristics of the light emitted from the light emitting regions, respectively;
a plurality of electrodes configured to control the light emitting regions to emit the light, respectively; and
an isolation insulating layer disposed between the light emitting regions to insulate the light emitting regions from one another, the isolation insulating layer forming a continuous structure with respect to the light emitting regions,
wherein the isolation insulating layer extends below a bottom of each of the light emitting regions.

18. A light emitting device package comprising:
a light emitting structure comprising a plurality of light emitting regions configured to emit light, respectively;
a plurality of light adjusting layers formed above the light emitting regions to change characteristics of the light emitted from the light emitting regions, respectively;
a plurality of electrodes configured to control the light emitting regions to emit the light, respectively; and
an isolation insulating layer disposed between the light emitting regions to insulate the light emitting regions from one another, the isolation insulating layer forming a continuous structure with respect to the light emitting regions,
wherein the isolation insulating layer comprises a plurality of insulating layers having different refractive indices.

19. The light emitting device package of claim 18, wherein the isolation insulating layer comprises side insulation portions disposed between the light emitting regions, and
wherein top surfaces of the side insulation portions are connected to one another through a buffer layer disposed between the light emitting structure and the light adjusting layers.

20. The light emitting device package of claim 19, wherein the buffer layer is a layer which was provided on a substrate on which the light emitting structure is grown, the substrate being removed after the light emitting structure is divided into the light emitting regions and before the light adjusting layers are disposed above the light emitting regions.

21. The light emitting device package of claim 19, wherein the buffer layer comprises a high resistance material which prevents the light emitting regions from being electrically connected to one another.

22. The light emitting device package of claim 20, wherein the buffer layer comprises AN, AlGaN, or InGaN.

* * * * *